(12) United States Patent
Lin

(10) Patent No.: US 7,448,778 B2
(45) Date of Patent: Nov. 11, 2008

(54) LAMP OF REFLECTOR DEVICE AND METHOD OF MANUFACTURING SAME

(76) Inventor: Yuan Lin, 5 Viewmont Court, Doncaster East, 3109 VIC (AU)

( * ) Notice: Subject to any disclaimer, the term of this patent is extended or adjusted under 35 U.S.C. 154(b) by 354 days.

(21) Appl. No.: 10/971,094

(22) Filed: Oct. 25, 2004

(65) Prior Publication Data
US 2005/0117352 A1 Jun. 2, 2005

(30) Foreign Application Priority Data
Dec. 2, 2003 (TW) .............................. 92133909 A

(51) Int. Cl.
*H01R 25/16* (2006.01)
(52) U.S. Cl. .................. 362/374; 362/249; 362/800
(58) Field of Classification Search ............... 439/110, 439/211; 362/249
See application file for complete search history.

(56) References Cited

U.S. PATENT DOCUMENTS 3,894,225 A * 7/1975 Chao .......................... 362/249
5,310,355 A * 5/1994 Dannatt ...................... 439/110

FOREIGN PATENT DOCUMENTS

TW 355642 4/1999
TW 383121 2/2000

* cited by examiner

*Primary Examiner*—Anabel M Ton

(57) ABSTRACT

Provided is a lamp of reflector device and method of manufacturing same. The lamp comprises a base including a plurality of apertures, a LED lamp mounted on the base, a support including side walls for forming a space and a plurality of apertures, a rivet assembly including a plurality of rivets inserted through the apertures of the base and the apertures of the support to fasten at the apertures of the base by soldering and electrically connect to the LED lamp, and bond filled in the space prior to solidification. The invention has advantages of being ease of mass production due to modularized design.

28 Claims, 27 Drawing Sheets

LAMP OF REFLECTOR DEVICE AND METHOD OF MANUFACTURING SAME

BACKGROUND OF THE INVENTION

1. Field of the Invention

The present invention relates to lamps and more particularly to a modularized lamp mounted in a reflector device having advantages of being ease of mass production and being waterproof and airtight, and method of manufacturing same.

2. Description of Related Art

A prior reflector belt (or reflector device) comprises a plurality of illuminators electrically coupled together by electric wires, a switch, a power supply (or batteries), a flash controller all coupled to the illuminators, and a reflective strip (or waterproof belt) for enclosing the above components. The reflector belt is typically stitched to a clothes or the like. Such design has been disclosed in Taiwanese Patent Published Nos. 355,642 and 383,121. However, it is impossible of manufacturing the prior art in a modularized, mass production since the coupling of illuminators, wires, and other electrical components and the stitching process are tedious and time consuming. Hence, the prior art finds it hard of putting into practice in industry. Moreover, in fact spacing between any two illuminators has to be adjusted in order to adapt to the article (e.g., shoulder belt or waist belt of a clothes) that the prior art is attached to. Thus, the manufacturer has to prepare many sets of illuminators having different spacings and belts of different lengths for fulfilling different needs of customers. This inevitably will increase the manufacturing cost and lower the production. Also, an additional waterproof treatment has to be done on the prior reflector belt. This further complicates the manufacturing process. To the worse one such reflector belt having a poor waterproof or airtight capability may cause danger (e.g., spark or explosion caused by exposing wires, flash controller, and illuminators to air having gas or other inflammable articles) when it is used in an environment requiring a highly safe operating standard. Hence, a need for improvement exists.

SUMMARY OF THE INVENTION

It is an object of the present invention to provide a lamp of reflector device and method of manufacturing same. By utilizing the present invention, advantages of being ease of mass production due to the provision of modular components, high quality, no additional equipment being required in the manufacturing process and thus saving cost, and being waterproof and airtight for enabling the reflector device to employ in an environment requiring a highly safe operating standard.

To achieve the above and other objects, the present invention provides a lamp of a reflector device, comprising a base including at least one aperture; a LED lamp mounted on the base; a support including side walls for forming a space and at least one aperture; a rivet assembly including at least one rivet inserted through the aperture of the base and the aperture of the support to fasten at the aperture of the base by soldering and electrically connect to the LED lamp; and bond filled in the space prior to solidification.

The present invention also provides a lamp of a reflector device, comprising a support including side walls for forming a space which is filled with bond; a base adhered on the space, the base including a plurality of apertures; a LED lamp mounted on an inner surface of the base facing the space; and a rivet assembly including a plurality of rivets inserted through the apertures of the base and fastened thereat by soldering, the rivets being projected from the support and being electrically connected to the LED lamp.

The present invention further provides a lamp of a reflector device, comprising a base including a plurality of apertures; a LED lamp mounted on the base; a support including a plurality of apertures; a rivet assembly including a plurality of rivets inserted through the apertures of the base and the apertures of the support to fasten at the apertures of the base by soldering and electrically connect to the LED lamp; and a cover plate secured onto the base, the cover plate including a plurality of upright pieces urged against a bottom of the support.

The present invention further provides a lamp of a reflector device, comprising a support including side walls for forming a space and a plurality of ribs in the space; a base in the space, the base including a plurality of apertures; a LED lamp secured to a bottom surface of the base facing the ribs; a rivet assembly including a plurality of rivets inserted through the apertures of the base and fastened thereat by soldering, the rivets being electrically connected to the LED lamp, and a cover plate secured onto a top surface of the base, the cover plate including a plurality of apertures for permitting the rivets to pass through.

The present invention further provides a lamp of a reflector device, comprising a support including side walls for forming a space and two upright, hollow cylinders; a LED lamp including two leads coupled to the cylinders, and a LED lamp element at a connecting point of the leads; a cover plate secured to a top surface of the support, the cover plate including a plurality of apertures; a rivet assembly including a plurality of rivets having a longitudinal channel, the rivets being inserted through the apertures of the cover plate to project from the support, and a plurality of conductive bars inserted in the channels of the rivets to electrically connect to the LED lamp.

The present invention further provides a lamp of a reflector device, comprising a base including a plurality of apertures; a LED lamp secured to the base; a rivet assembly including a plurality of rivets inserted through the apertures of the base to be electrically connected to the LED lamp, and an encapsulation formed of bond for enclosing the base, the LED lamp, and the rivet assembly wherein the rivet assembly is projected from the encapsulation.

The present invention further provides a method of manufacturing a lamp of a reflector device, comprising securing a LED lamp to a base; inserting a plurality of rivets through the base to electrically couple to the LED lamp; fastening the base together with the secured LED lamp and the rivets in a support by inserting the rivets through a plurality of apertures of the support; adhering a film on the support; filling bond in the support to enclose the base and the LED lamp for forming an encapsulation; baking the encapsulation; and removing the film.

The present invention further provides a method of manufacturing a lamp of a reflector device, comprising securing a LED lamp to a base; inserting a plurality of rivets through the base to electrically couple to the LED lamp; filling bond in a support; fastening the base together with the secured LED lamp and the rivets on the bond in the support for forming an encapsulation with the LED lamp facing the bond; and baking the encapsulation.

The present invention further provides a method of manufacturing a lamp of a reflector device, comprising securing a LED lamp to a base; inserting a plurality of rivets through the base to electrically couple to the LED lamp; fastening the base together with the secured LED lamp and the rivets in a support by inserting the rivets through a plurality of apertures of the support; filling bond in the support to enclose the base and the LED lamp; placing a cover plate on the support; and fastening the cover plate and the support together by means of a welder.

The present invention further provides a method of manufacturing a lamp of a reflector device, comprising securing a LED lamp to a base; inserting a plurality of rivets through the base to electrically couple to the LED lamp; fastening the base together with the secured LED lamp and the rivets in a support by inserting the rivets through a plurality of apertures of the support; placing a cover plate on the support; and fastening the cover plate and the support together by means of a welder.

The present invention further provides a method of manufacturing a lamp of a reflector device, comprising securing a LED lamp to a base; inserting a plurality of rivets through the base to electrically couple to the LED lamp; placing a cover plate on the support; and fastening the cover plate and the support together by means of a welder.

The present invention further provides a method of manufacturing a lamp of a reflector device, comprising securing a LED lamp to a base; inserting a plurality of rivets through the base to electrically couple to the LED lamp; placing the base together with the secured LED lamp and the rivets in a support; placing a cover plate on the support; inserting the rivets through a plurality of apertures of the cover plate; and fastening the cover plate and the support together by means of a welder.

The present invention further provides a method of manufacturing a lamp of a reflector device, comprising securing a LED lamp to a plurality of upright, hollow cylinders in a base; inserting a plurality of rivets through a cover plate to electrically couple to the LED lamp; placing a cover plate on the support; inserting the rivets through the support to project therefrom; and fastening the cover plate and the support together by means of a welder.

The present invention further provides a method of manufacturing a lamp of a reflector device, comprising securing a LED lamp to a base; inserting a plurality of rivets through the base to electrically couple to the LED lamp; placing the base together with the secured LED lamp and the rivets on a die of an injection molding machine; and activating a punch to press the base for forming a lamp unit.

The above and other objects, features and advantages of the present invention will become apparent from the following detailed description taken with the accompanying drawings.

DETAILED DESCRIPTION OF THE PREFERRED EMBODIMENTS

Figure 1:
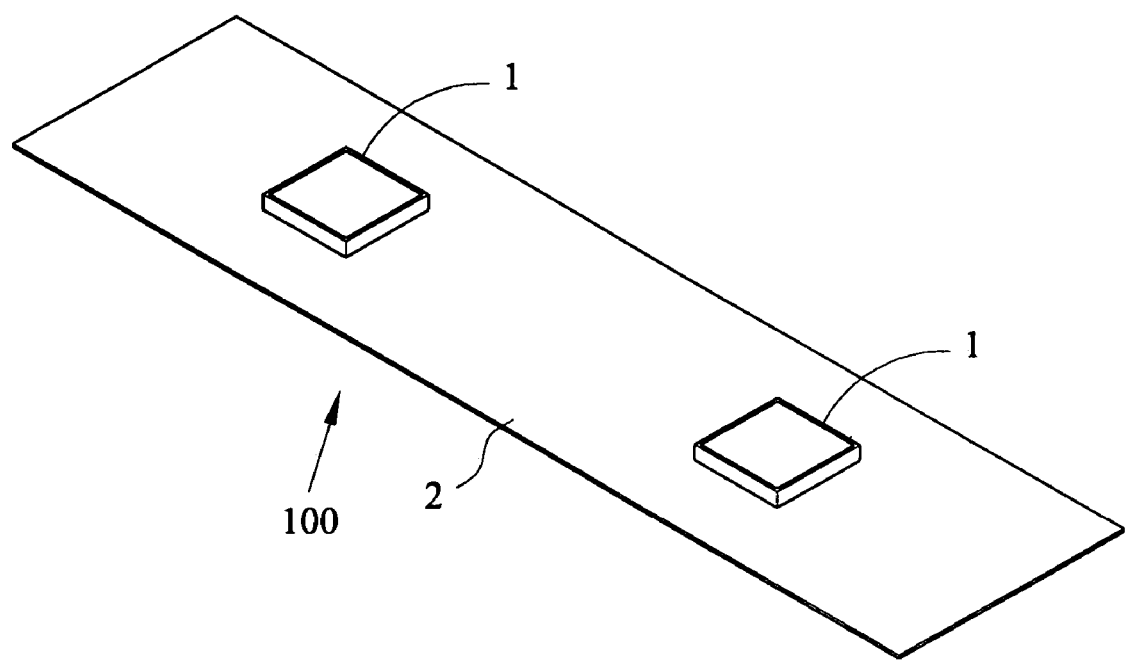
FIG. 1 is a perspective view of a portion of a reflector device according to the invention.

Referring to FIG. 1, there is shown two lamp units 1 mounted on a reflective belt unit 2 to form a reflector device 100 in accordance with the invention. The reflector device 100 is used as warning means due to the flashing feature of the lamp units 1. Also, the reflector device 100 finds an application of warning by stitching to clothes or the like. The components of the lamp unit 1 will be described in detail below.

Figure 2:
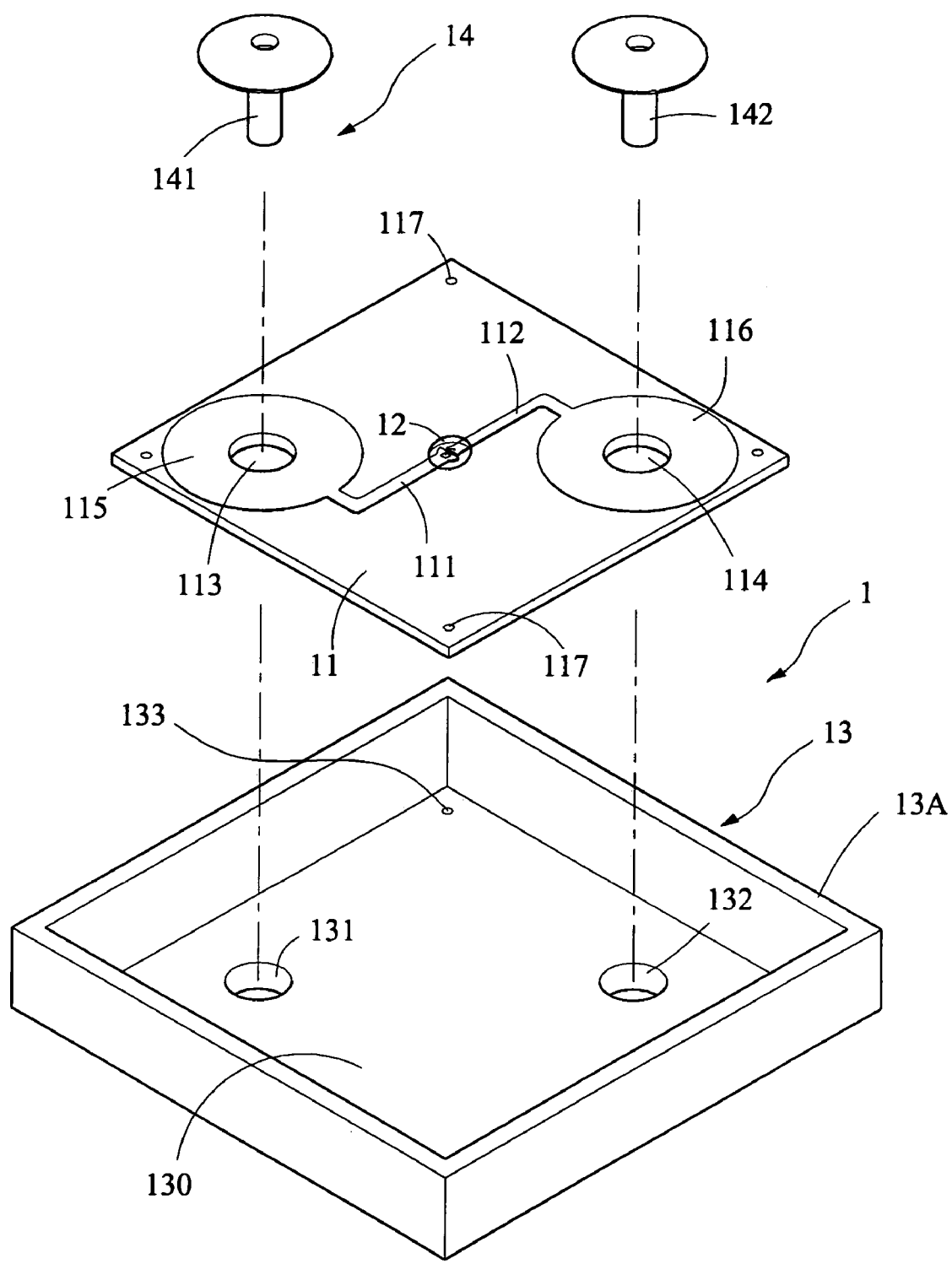
FIG. 2 is an exploded perspective view of a lamp unit of the reflector device.
Figure 3:
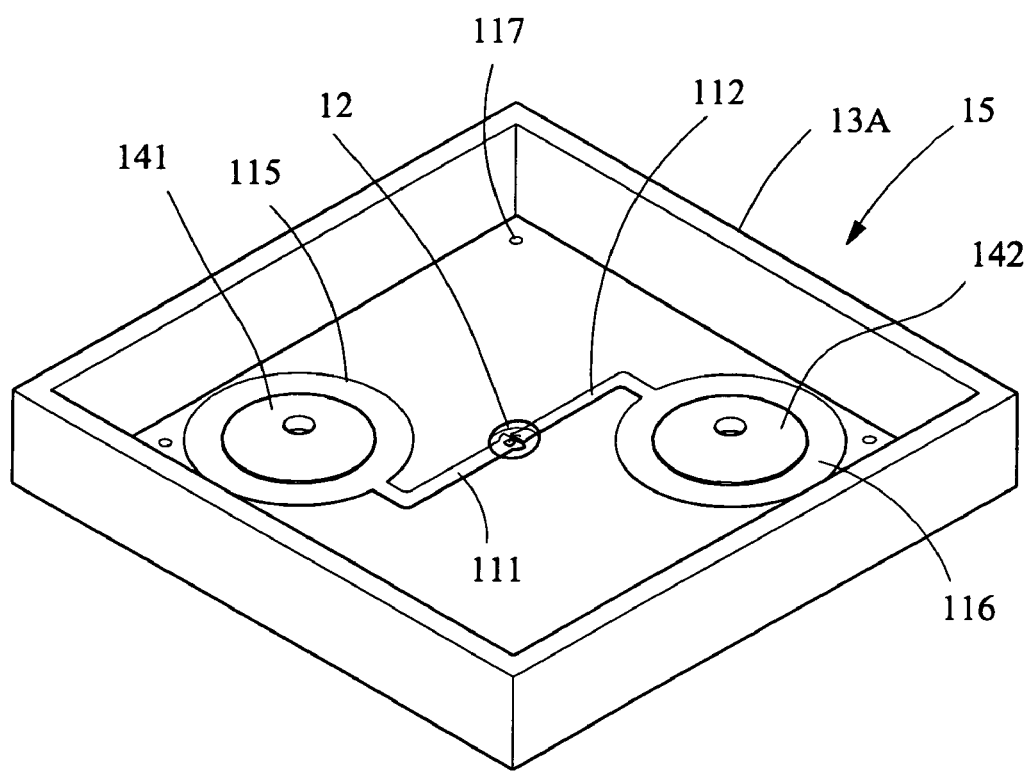
FIG. 3 is a perspective view of FIG. 2.
Figure 4:
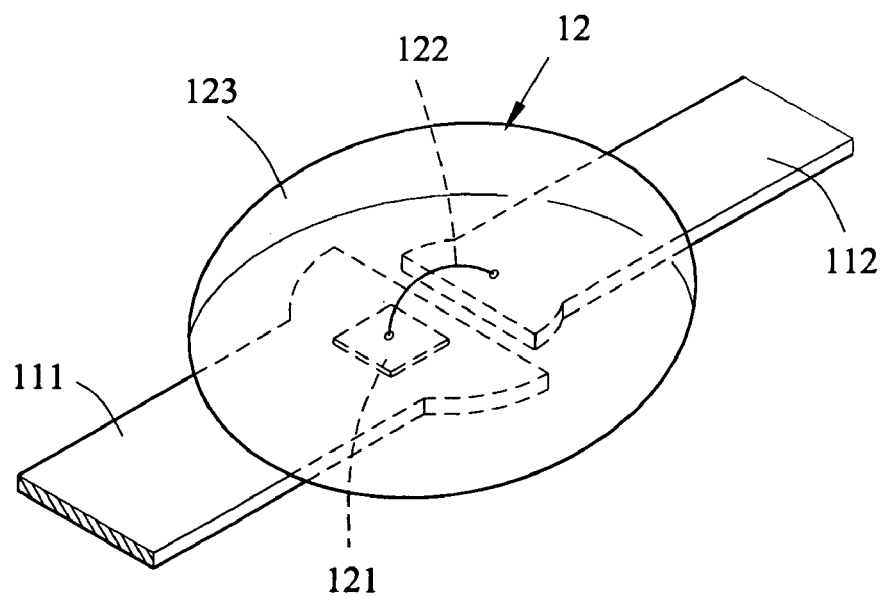
FIG. 4 is a perspective view of a LED lamp of the lamp unit according to a first preferred embodiment of the invention.

Referring to FIGS. 2 to 4, the lamp unit 1 comprises a base 11, a LED (light-emitting diode) lamp 12, a seat assembly 13, and a rivet assembly 14 including a plurality of rivets 141 and 142. The base 11 comprises a substrate having two contacts 115, 116, two electric wires 111, 112 and two apertures 113, 114. The contact 115 is provided at the aperture 113 and another contact 116 is provided at the aperture 114 so as to electrically couple to the wires 111 and 112 respectively as a portion of the electrical connection of the lamp unit 1. A plurality of holes 117 are provided at corners of the base 11 as means of bond injection or ventilation. The LED lamp 12 is provided at a connecting point of the wires 111 and 112 and comprises a LED die 121 on the wire 111 and a lead 122 coupled between the LED die 121 and the wire 112. The LED lamp 12 is enclosed by an encapsulation 123 (e.g., epoxy) to form a COB (chip on board) based LED.

The seat assembly 13 is adapted to receive the LED lamp 12 and the rivet assembly 14 and comprises a rectangular support 13A having four side walls for forming a space 130 to receive the base 11. The seat assembly 13 further comprises two spaced apertures 131 and 132 and a plurality of holes 133 adjacent the corners. The holes 133 are aligned with the holes 117 as means of bond injection or ventilation. The rivets 141 and 142 are inserted through the apertures 113, 114 of the base 11 and the apertures 131 and 132 of the support 13A to fasten on the contacts 115 and 116 by soldering. As such, the base 11 is fastened within the support 13A to form a support assembly 15 for the facilitation of a subsequent encapsulation (as detailed later). In addition, a plurality of waterproof rings 134 are provided at the underside of the support 13A and each waterproof ring 134 is tightly put on the passed shank of either rivet 141 or 142. As such, waterproof capability of the reflector device can be obtained by mounting the lamp unit 1 on the belt unit 2 and then flattening the shanks of the rivets 141 and 142 to compress the waterproof rings 134 (see FIG. 9).

A number of other preferred embodiments of the support assembly 15 will be described in detailed below.

Figure 5:
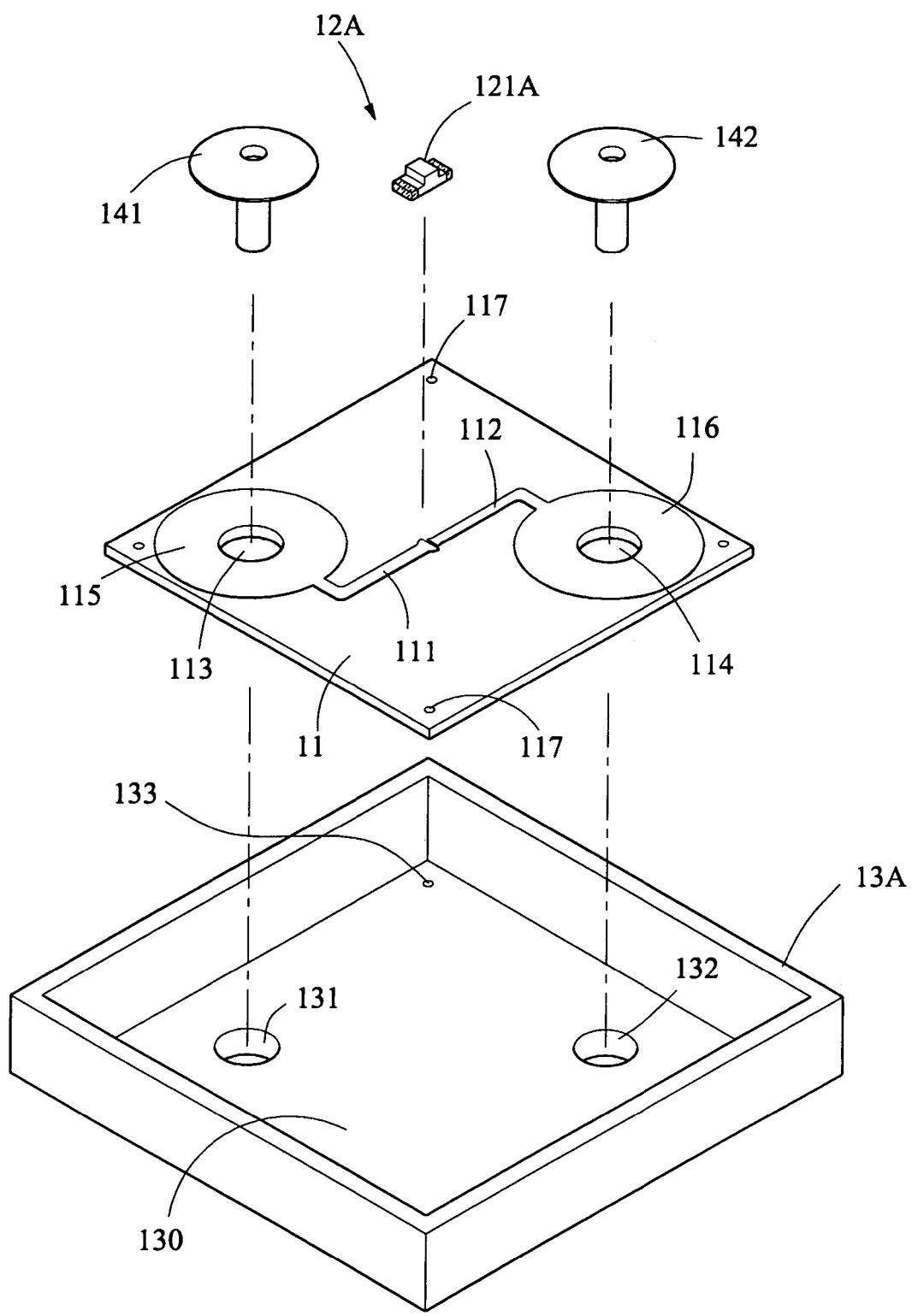
FIG. 5 is an exploded perspective view of a LED lamp according to a second preferred embodiment of the invention.
Figure 6:
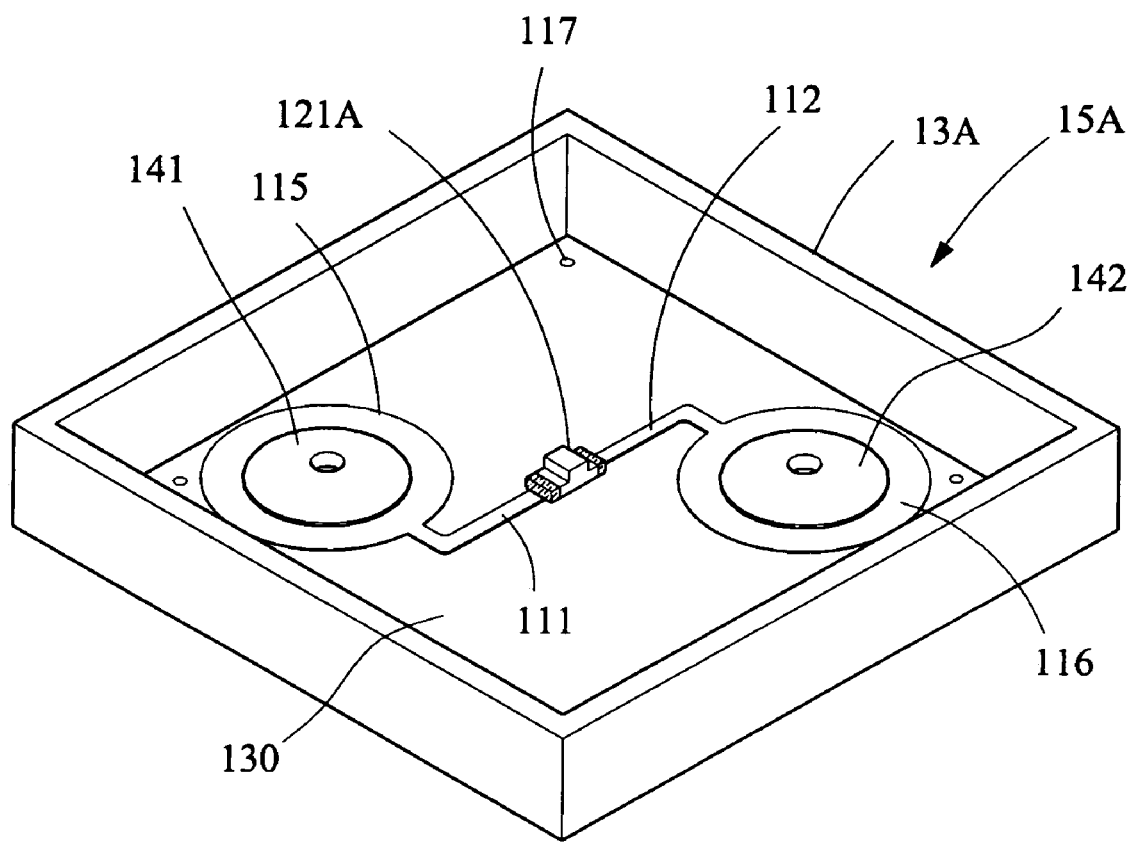
FIG. 6 is a perspective view of the assembled LED lamp shown in FIG. 5.

Referring to FIGS. 5 and 6, in the preferred embodiment of support assembly 15 the LED lamp 12 comprises a LED die 121A which is formed at a connecting point of the wires 111 and 112 by SMD (surface mounting) (i.e., SMD based LED).

Next, insert the rivets 141 and 142 through the apertures 113, 114 on the base 11 and the apertures 131 and 132 on the support 13A to fasten on the contacts 115 and 116 by soldering. As an end, a support assembly 15A is formed.

Figure 7:
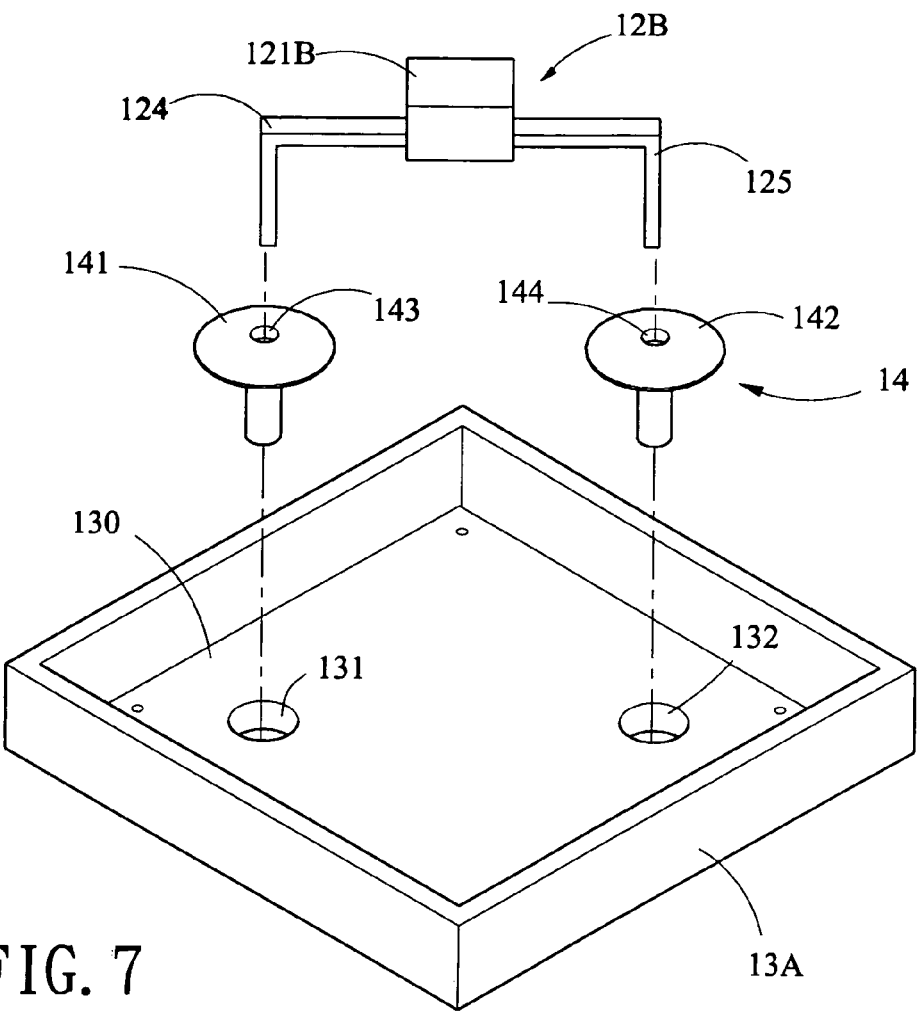
FIG. 7 is an exploded perspective view of a LED lamp according to a third preferred embodiment of the invention.
Figure 8:
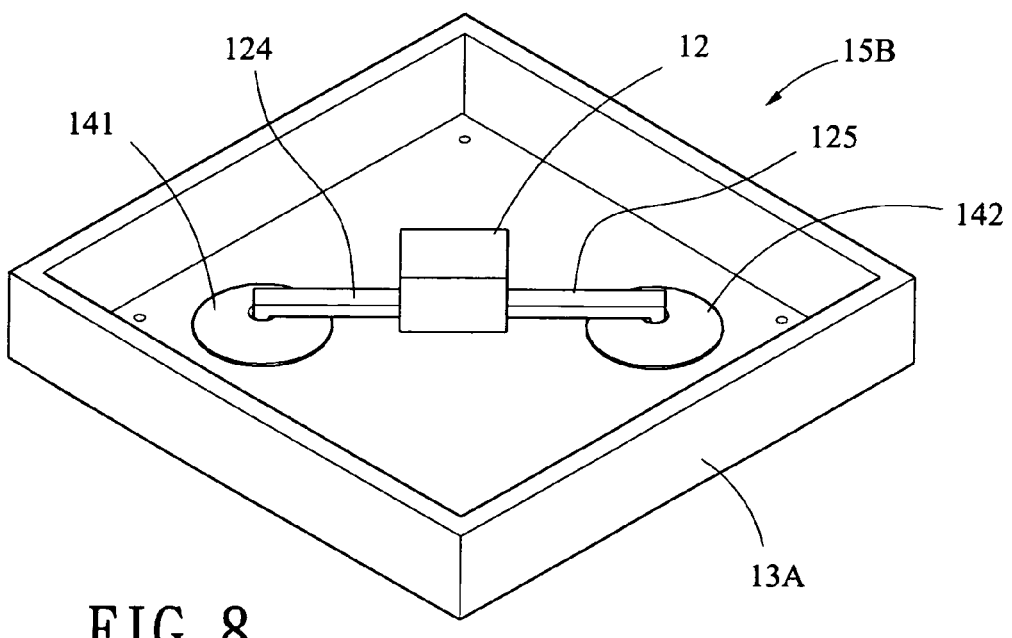
FIG. 8 is a perspective view of the assembled LED lamp shown in FIG. 7.

Referring to FIGS. 7 and 8, in the preferred embodiment of support assembly 15B different from above the support assembly 15B comprises a support 13A, a rivet assembly 14, and a LED lamp 12B in which the LED lamp 12B comprises two leads 124 and 125 and a LED lamp element 121B at a connecting point of the leads 124 and 125 (i.e., lead frame based LED is formed). In assembly, first insert the rivets 141 and 142 through the apertures 131 and 132 of the support 13A. Next, insert bent portions of the leads 124 and 125 into apertures 143 and 144 of the rivets 141 and 142 respectively. Finally, the LED lamp 12B is secured to the rivets 141 and 142 by soldering. As an end, a support assembly 15B is formed.

Figure 9:
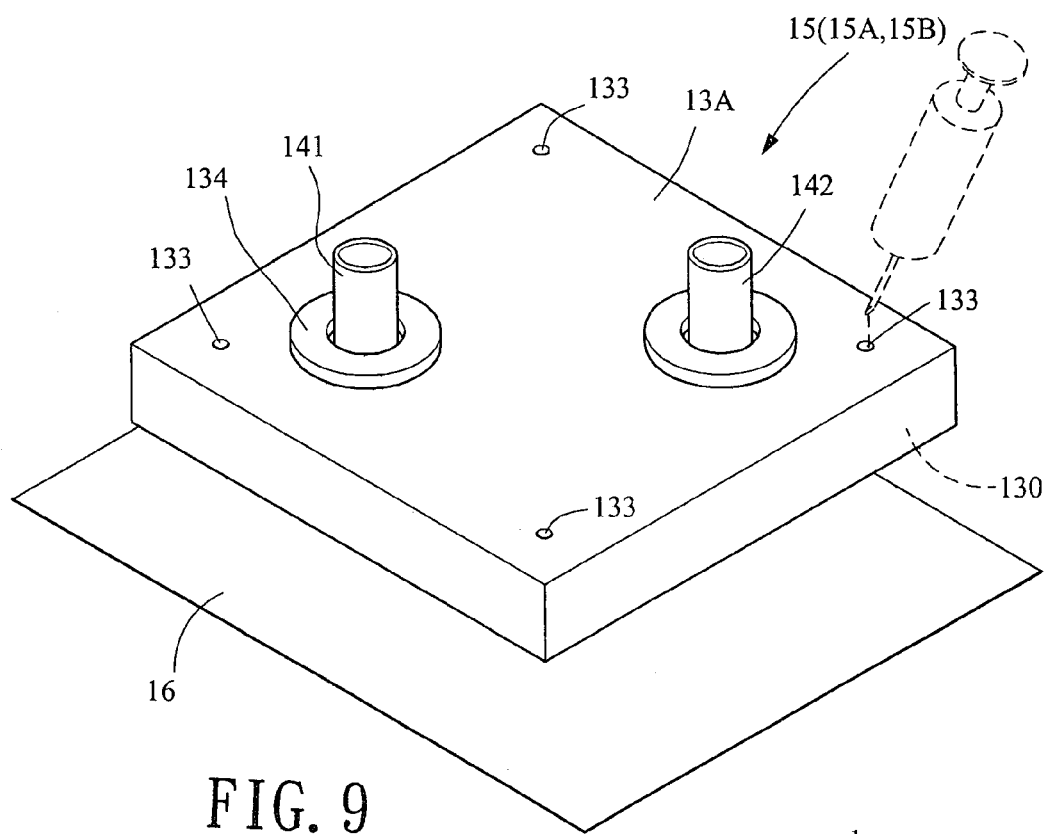
FIG. 9 is a perspective view illustrating a process of injecting bond into the lamp unit.
Figure 10:
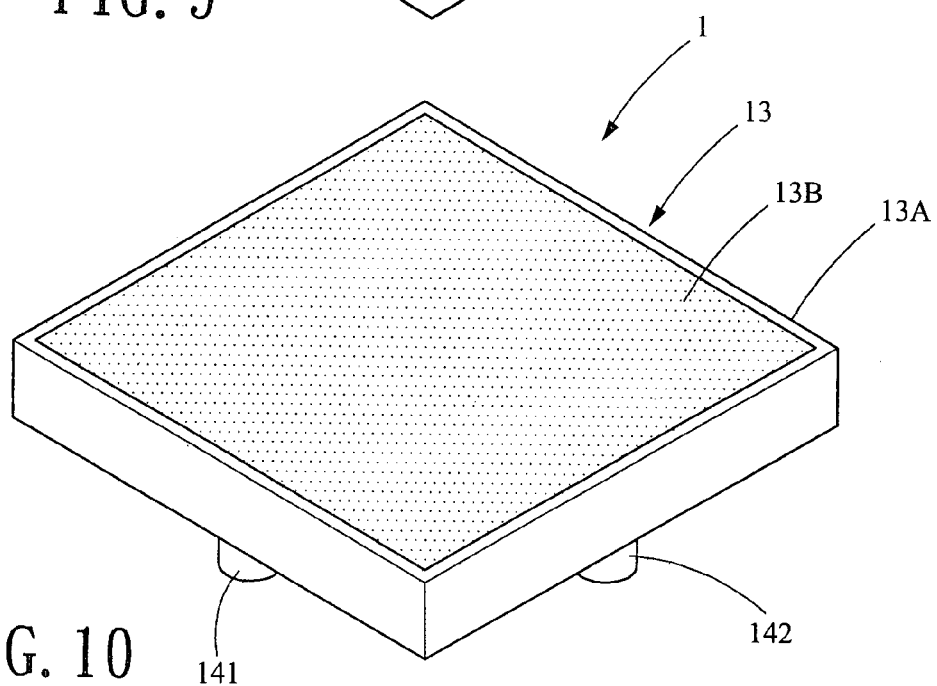
FIG. 10 is a perspective view of the lamp unit after finishing the bond injection in FIG. 9.

Referring to FIGS. 9 and 10, a process of injecting bond into the lamp unit 1 according to a first preferred embodiment of the invention is shown. As shown in FIG. 9, a film 16 is adhered on the surface of the space 130 in the support assembly 15 (or support assembly 15A or 15B). Next, a process of bond (e.g., epoxy) injection is performed at the holes 133 to fill bond in the space 130 to enclose the base 11 and the LED lamp 12 in the support 13A and form an encapsulation 13B of the seat assembly 13. The support assembly 15 is then sent to an oven to bake. After baking, the film 16 can be removed to form a lamp unit 1 having exposed rivets 141 and 142 (FIG. 10).

Figure 11:
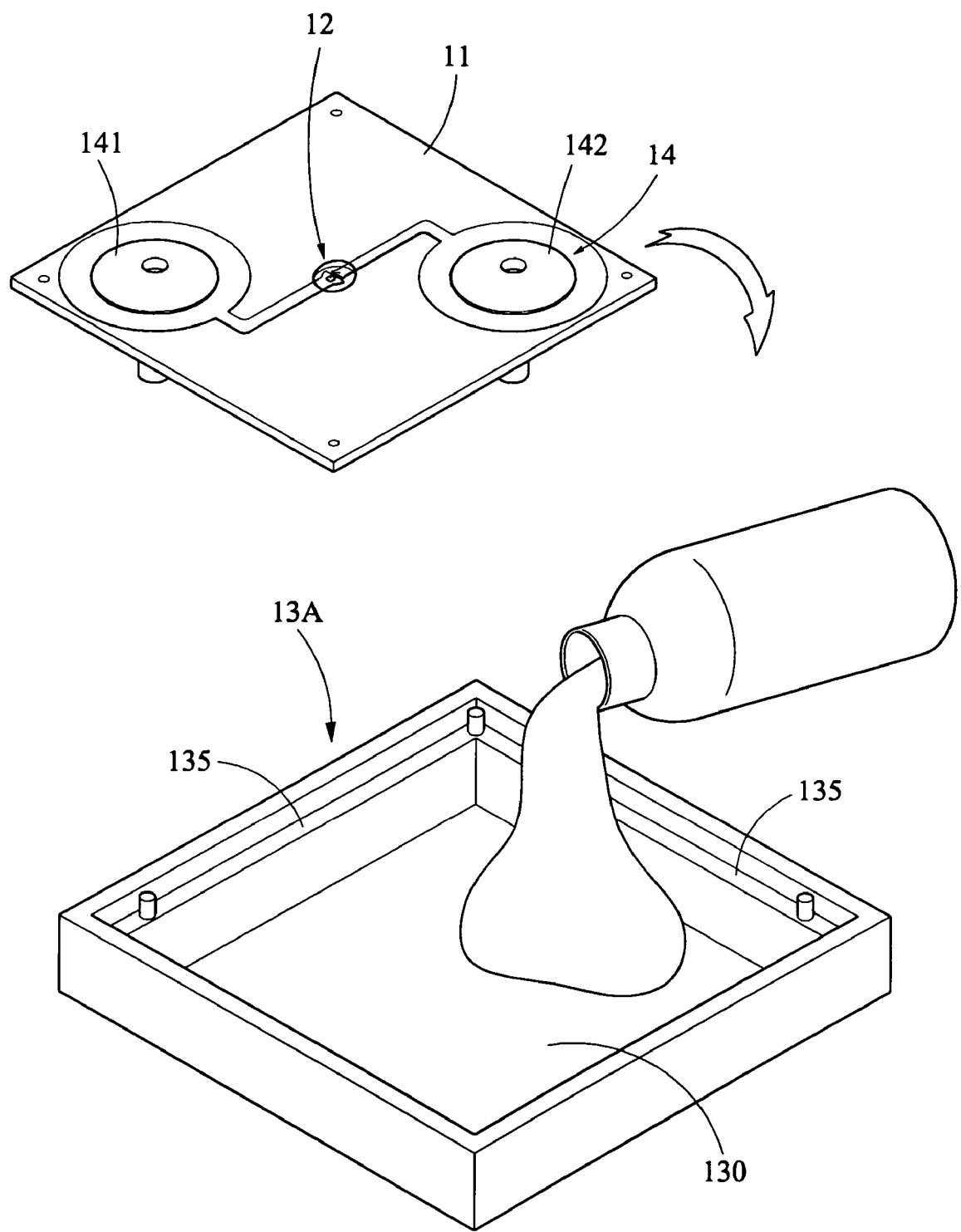
FIG. 11 is an exploded perspective view illustrating a first step of injecting bond into the lamp unit according to the second preferred embodiment of the invention.
Figure 12:
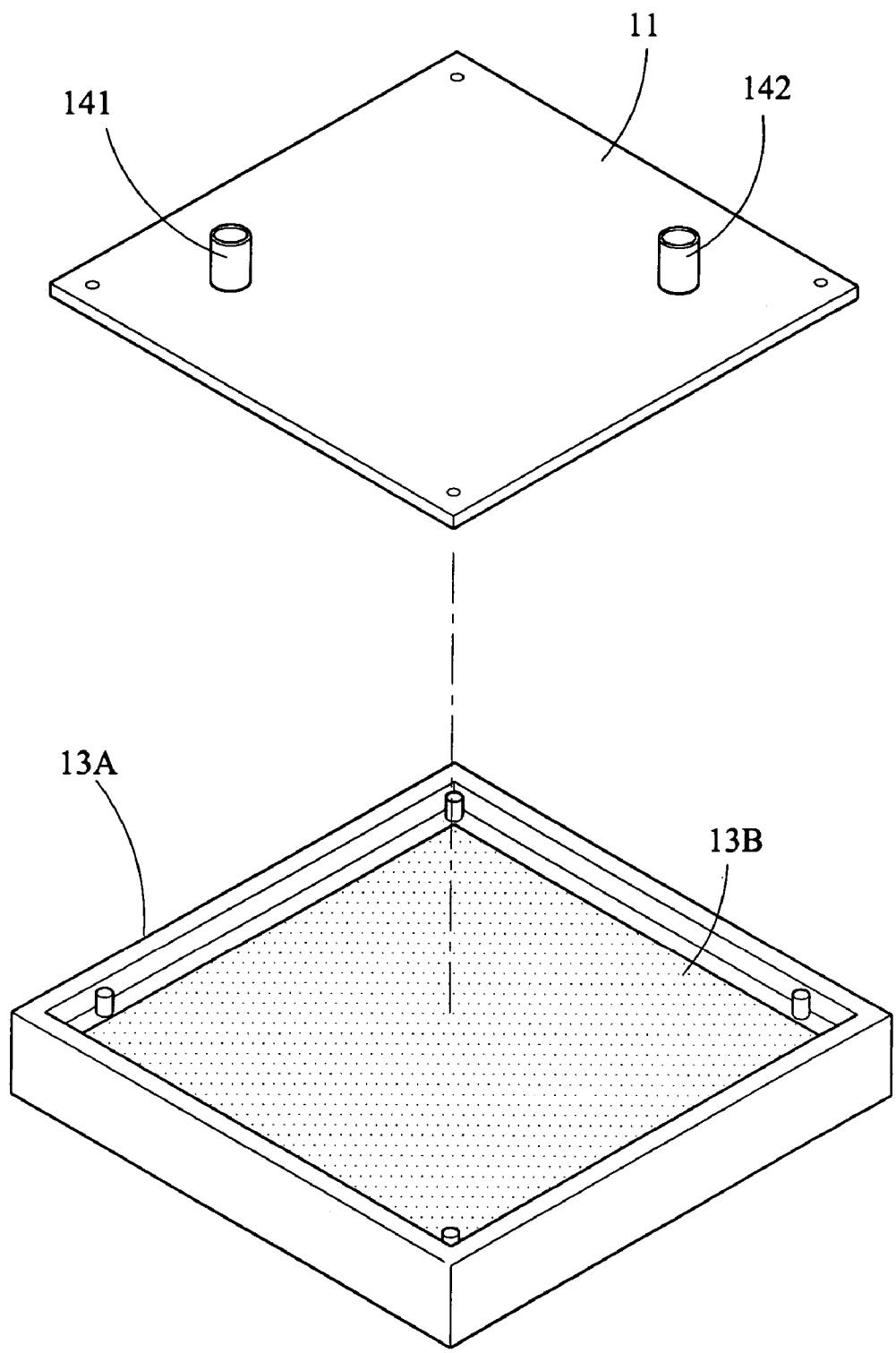
FIG. 12 is an exploded view illustrating a second step of flattening bond on the lamp unit shown in FIG. 11.
Figure 13:
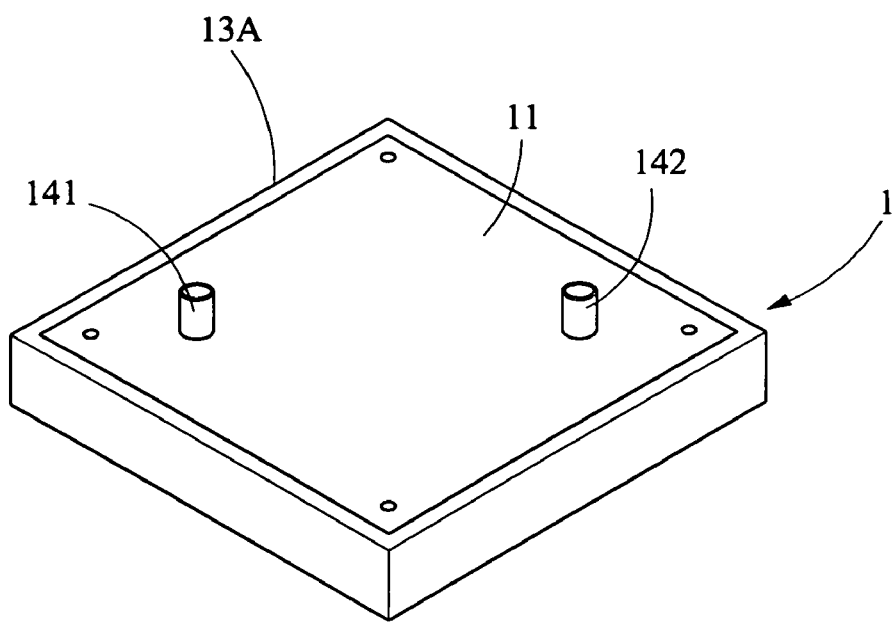
FIG. 13 is a perspective view illustrating a third step of adhering base onto the lamp unit shown in FIG. 12.
Figure 14:
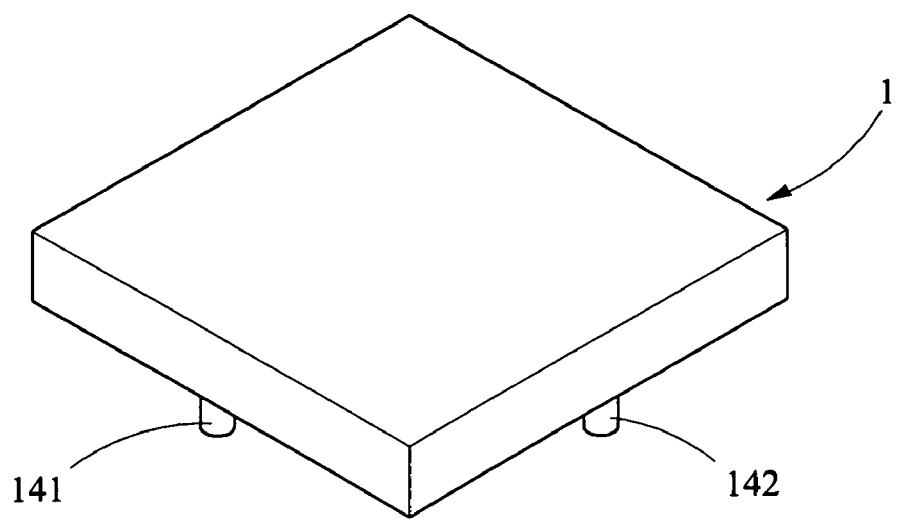
FIG. 14 is another perspective view of the lamp unit opposite to that shown in FIG. 13.

Referring to FIGS. 11 and 12, a process of injecting bond into the lamp unit 1 according to a second preferred embodiment of the invention is shown. The LED lamp 12 is a COB based LED (as shown), SMD based LED, or lead frame based LED. The LED lamp 12 and the rivet assembly 14 are mounted in the base 11. Next, a process of bond (e.g., epoxy) injection is performed to fill bond in the space 130 to form an encapsulation 13B. The base 11 is then placed on the support 13A for covering prior to sending to an oven to bake. After baking, a lamp unit 1 having exposed rivets 141 and 142 is formed. Referring to FIGS. 13 and 14, a peripheral groove 135 (see FIG. 11) is formed around inner surfaces of the walls of the support 13A for facilitating a fitting of the base 11 onto the support 13A (i.e., onto the groove 135) and adhesion thereafter.

Figure 15:
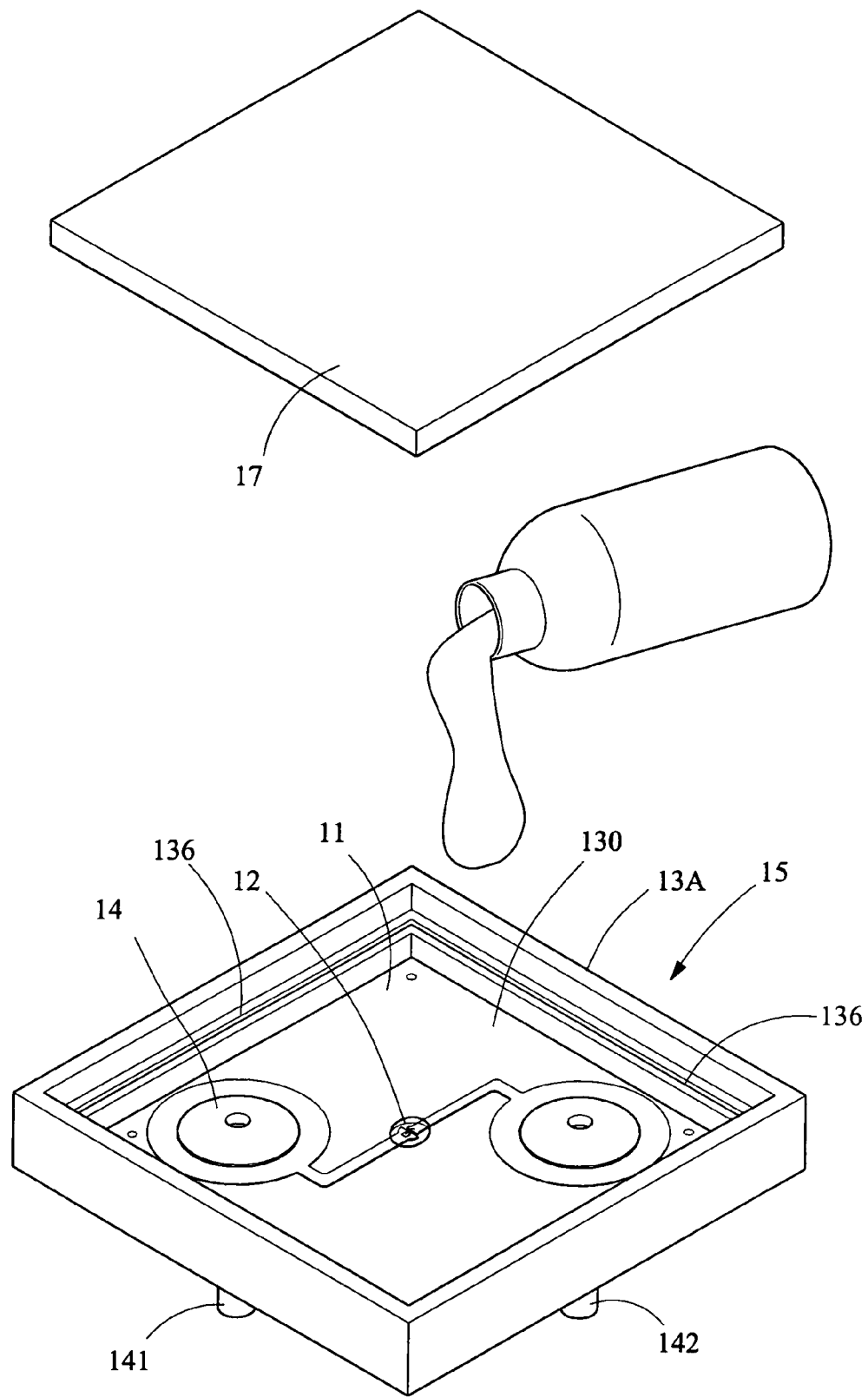
FIG. 15 is an exploded perspective view illustrating a first step of injecting bond into the lamp unit according to the third preferred embodiment of the invention.
Figure 16:
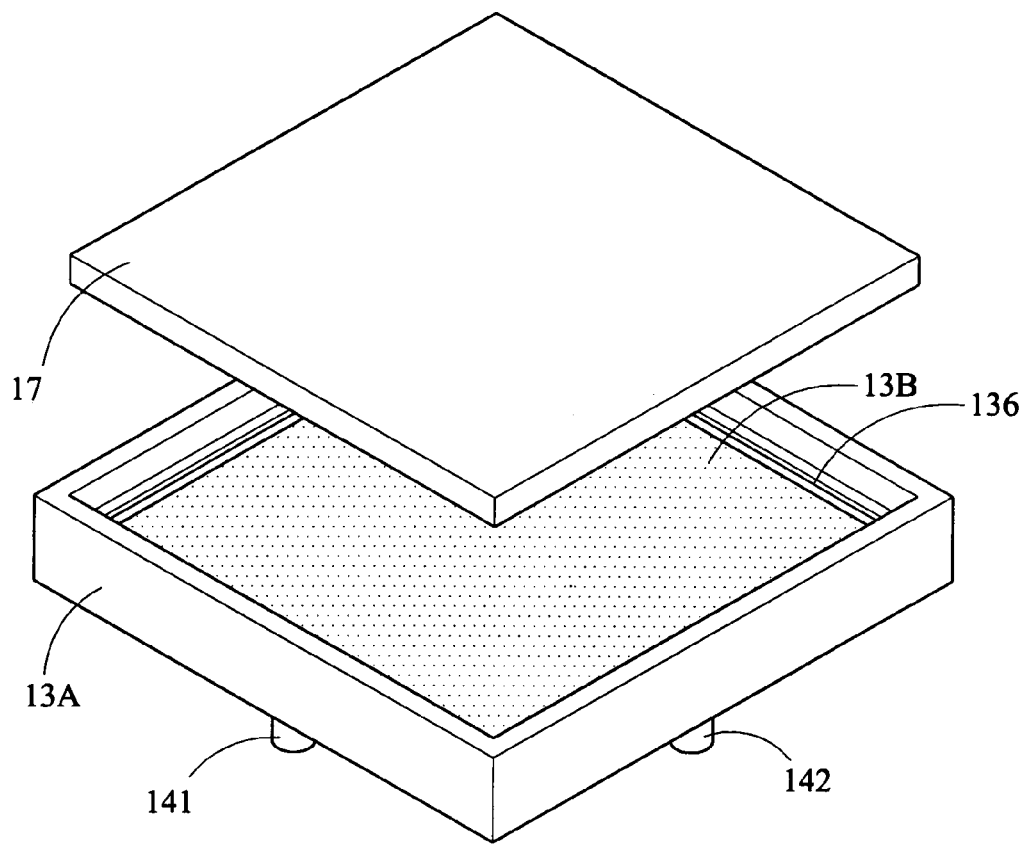
FIG. 16 is an exploded perspective view illustrating a second step of flattening bond on the lamp unit shown in FIG. 15.
Figure 17:
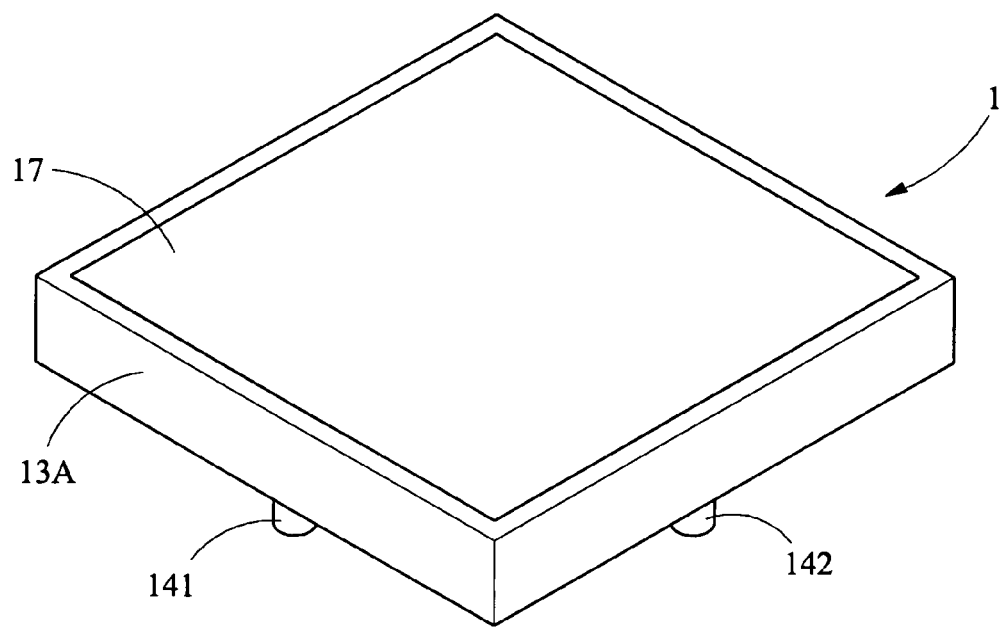
FIG. 17 is a perspective view illustrating a third step of adhering cover plate onto the lamp unit shown in FIG. 16.

Referring to FIGS. 15 and 16, a process of injecting bond into the lamp unit 1 according to a third preferred embodiment of the invention is shown. The base 11, the LED lamp 12, and the rivet assembly 14 are mounted in the support 13A to form a support assembly 15 (or support assembly 15A or 15B). Next, fill bond in the space 130 to form an encapsulation 13B. A cover plate 17 is then placed on the support 13A for covering prior to being fastened together by means of an ultrasonic welder. As an end, a lamp unit 1 having exposed rivets 141 and 142 is formed (see FIG. 17). Also, a peripheral groove 136 is formed around inner surfaces of the walls of the support 13A for facilitating a fitting of the cover plate 17 onto the support 13A (i.e., onto the groove 136) and adhesion thereafter.

Figure 18:
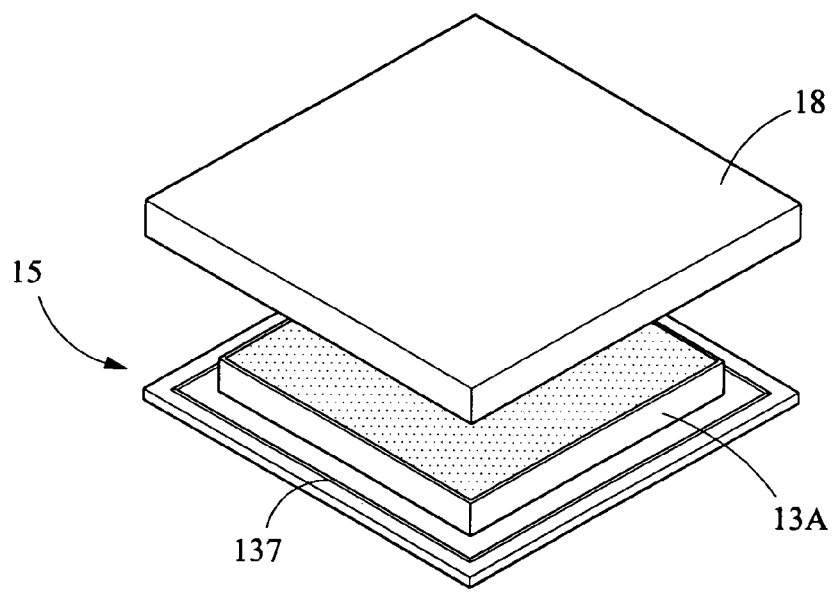
FIG. 18 is an exploded view showing another cover plate to be mounted on the support assembly according to the third preferred embodiment of the invention.
Figure 19:
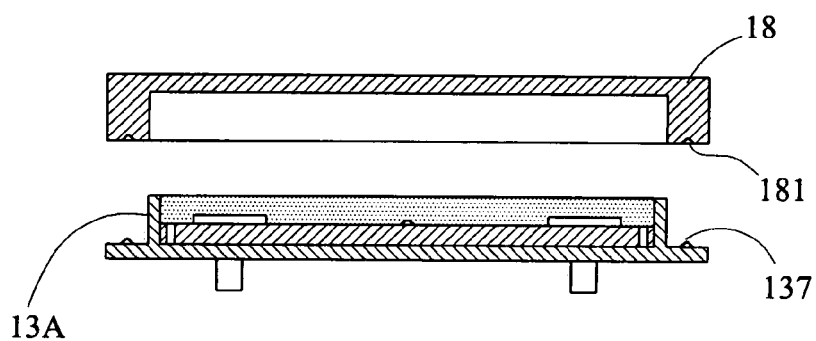
FIG. 19 is a cross-sectional view of FIG. 18.
Figure 20:
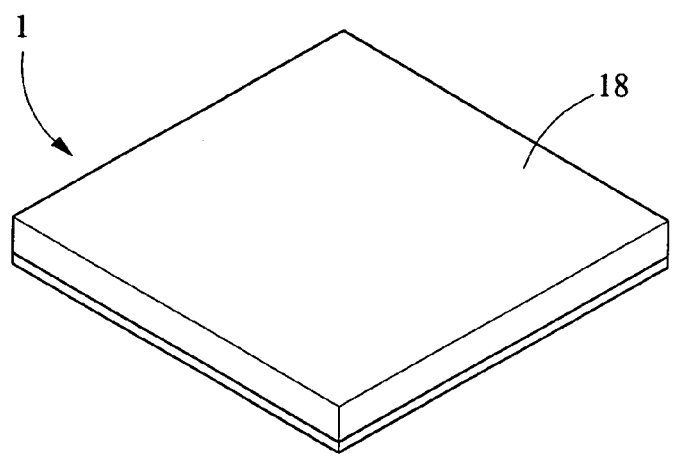
FIG. 20 is a perspective view of another cover plate mounted on the support assembly shown in FIG. 18 to form a lamp unit.

Referring to FIGS. 18 and 19, a peripheral ridge 137 is formed around projecting edges of the support 13A for facilitating a fitting of a peripheral trough 181 of a cap-like cover plate 18 onto the support 13A (i.e., fastened at the ridge 137) to form a lamp unit 1 (see FIG. 20).

Figure 21:
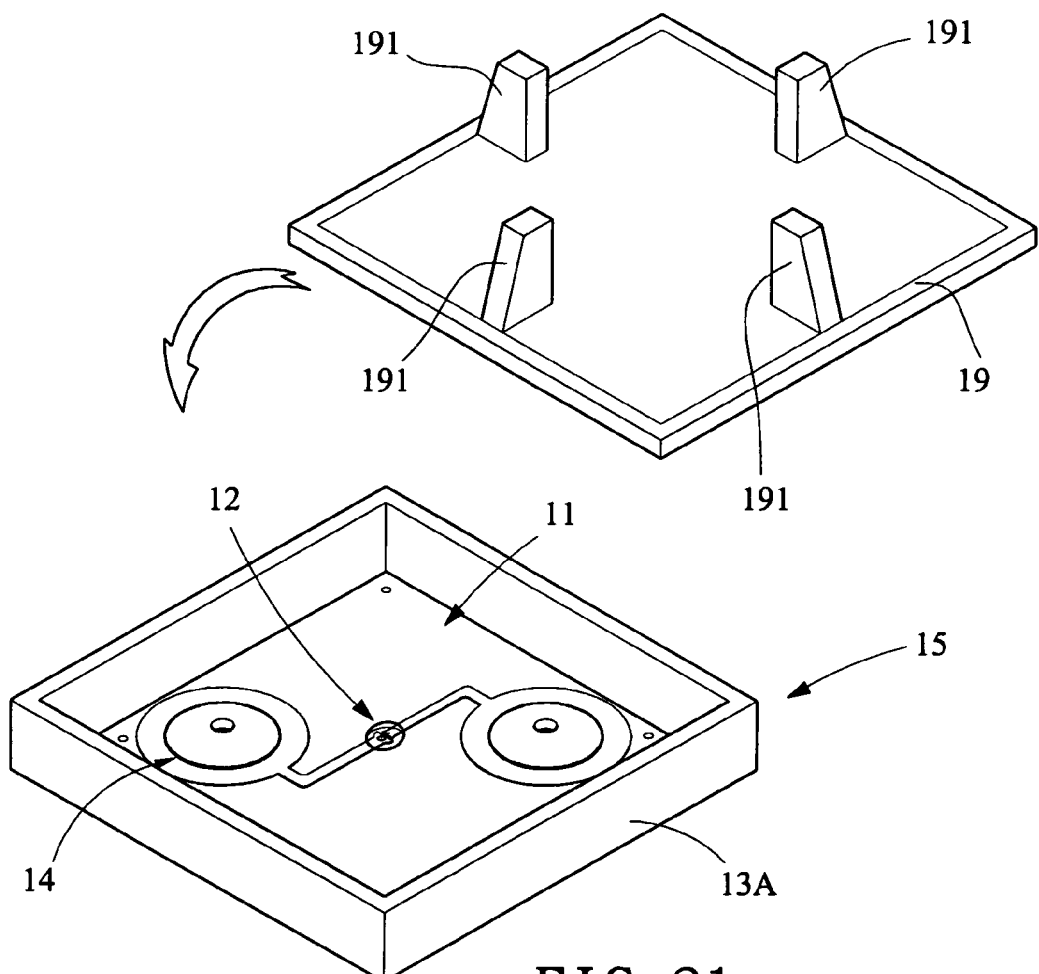
FIG. 21 is an exploded perspective view showing a lamp unit to be formed by welding according to a fourth preferred embodiment of the invention.
Figure 22:
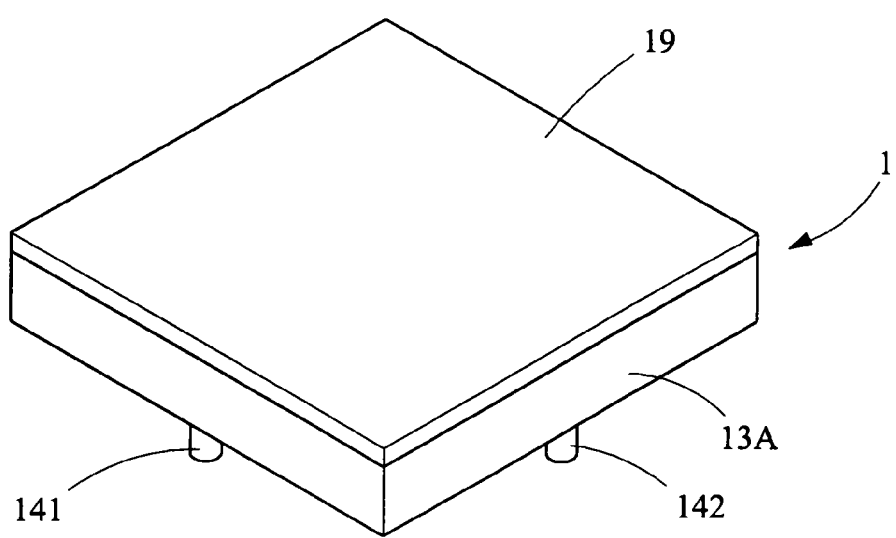
FIG. 22 is a perspective view of the formed lamp unit shown in FIG. 21.

Referring to FIG. 21, a lamp unit to be formed by welding according to a preferred embodiment of the invention is shown. The base 11, the LED lamp 12, and the rivet assembly 14 are mounted in the support 13A to form a support assembly 15 (or support assembly 15A or 15B). Next, a cover plate 19 is placed on the support 13A for covering. The cover plate 19 comprises a plurality of equally spaced apart upright pieces 191 urged against the inner surfaces of the walls of the support 13A as support. Next, the cover plate 19 and the support 13A are fastened together by means of a high-frequency or ultrasonic welder. As an end, a lamp unit 1 having exposed rivets 141 and 142 is formed (see FIG. 22).

Figure 23:
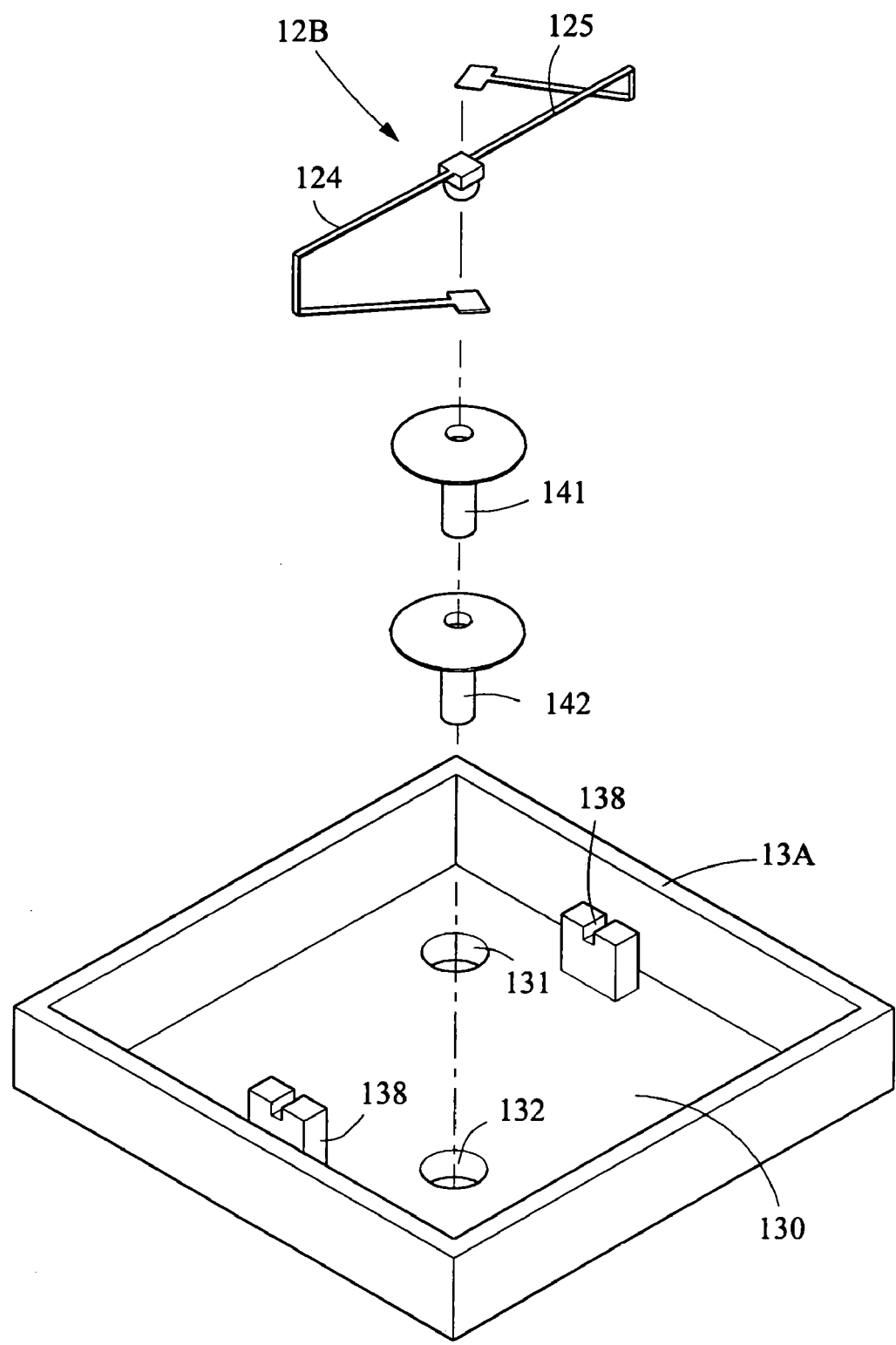
FIG. 23 is an exploded perspective view showing a portion of lamp unit to be formed according to a fifth preferred embodiment of the invention.
Figure 24:
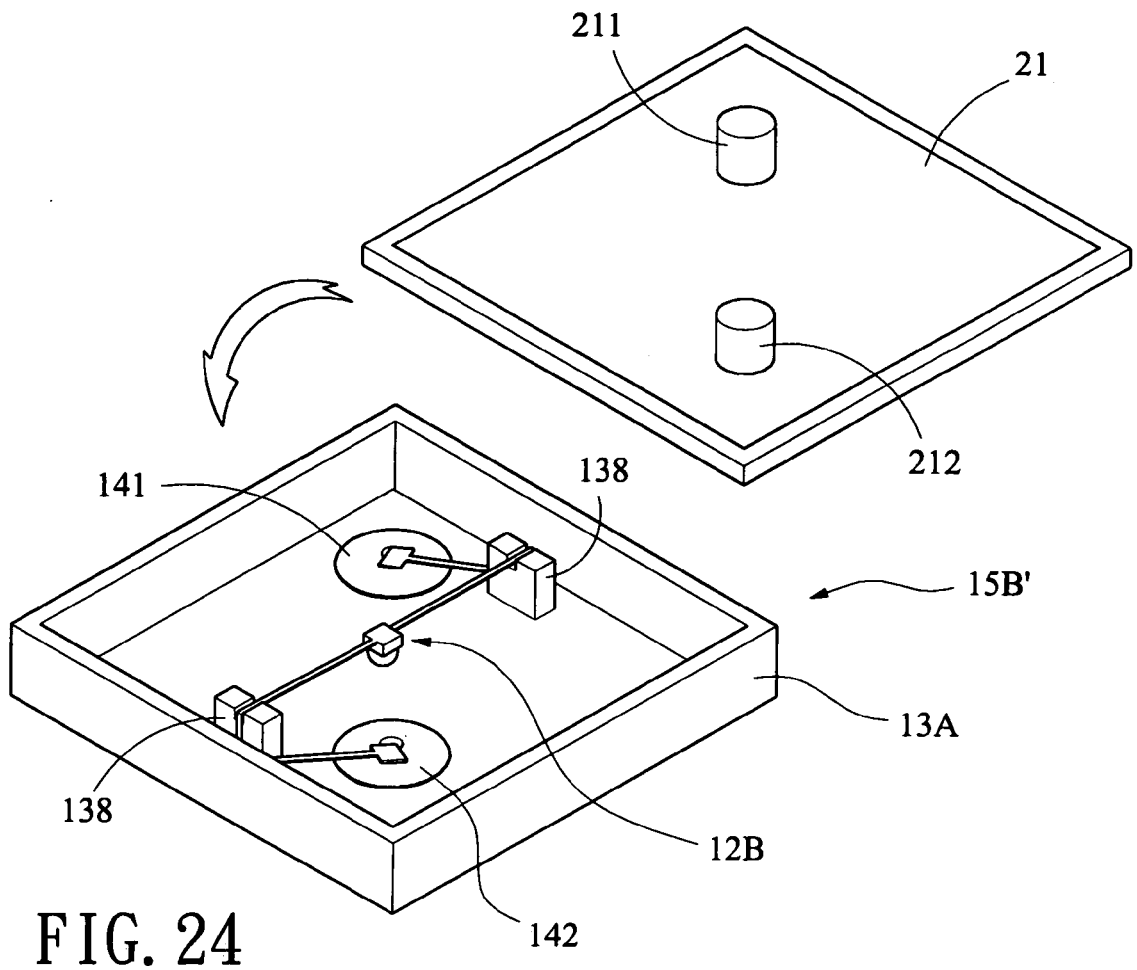
FIG. 24 is a perspective view of the formed portion of lamp unit shown in FIG. 23, where the portion of lamp unit is to be secured to still another cover plate by welding.
Figure 25:
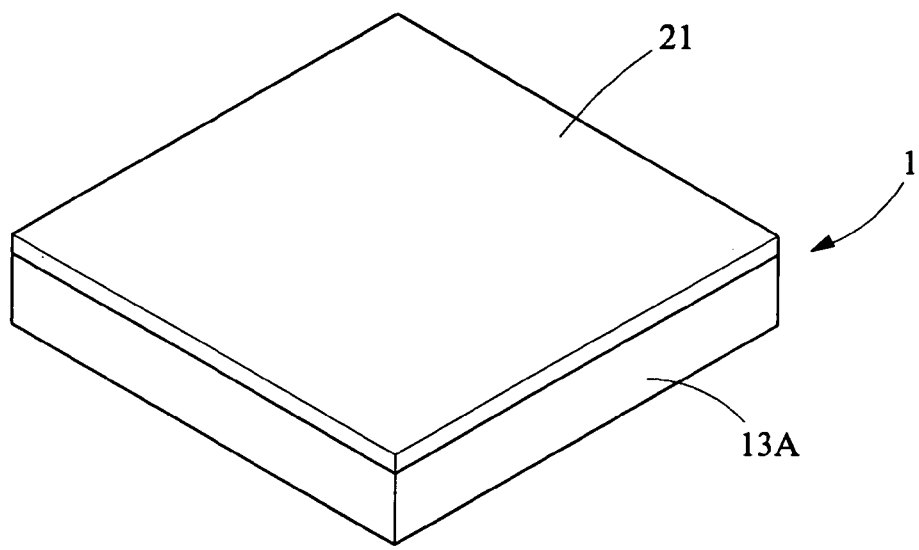
FIG. 25 is a perspective view of the formed lamp unit shown in FIG. 24.

Referring to FIGS. 23 and 24, two opposite posts 138 having a top cavity are formed in the space 130 for fastening the leads 124 and 125 of the LED lamp 12B (i.e., lead frame based LED). Next, insert the rivets 141 and 142 through the apertures 131 and 132 on the support 13A. Next, fasten the leads 124 and 125 of the LED lamp 12B on the rivets 141 and 142 by soldering. As an end, a support assembly 15B' is formed. A cover plate 21 is then placed on the support 13A for covering. The cover plate 21 comprises two spaced upright cylinders 212 urged against the rivets 141 and 142. Next, the cover plate 21 and the support 13A are fastened together by means of a high-frequency or ultrasonic welder. As an end, a lamp unit 1 having exposed rivets 141 and 142 is formed (see FIG. 25).

Figure 26:
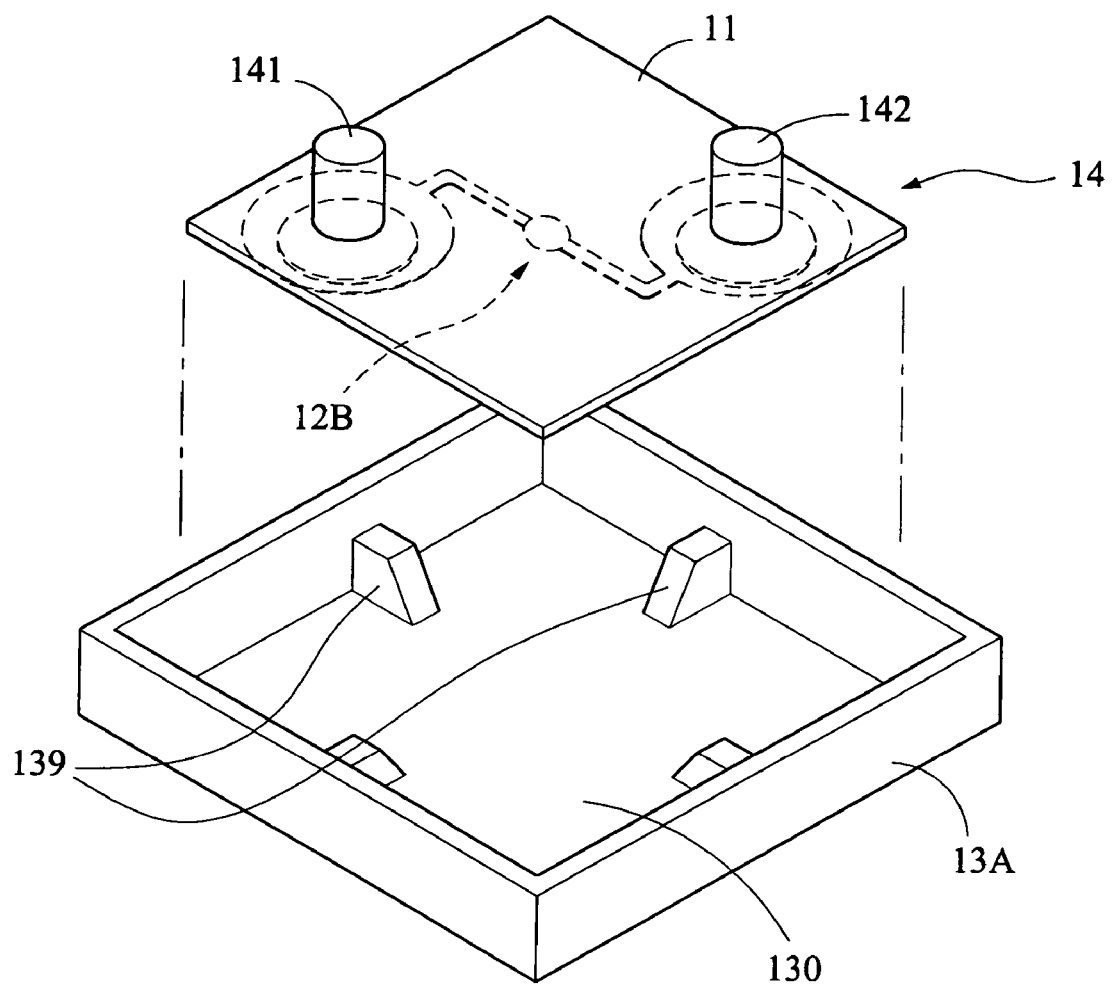
FIG. 26 is an exploded perspective view showing a portion of lamp unit to be formed according to a sixth preferred embodiment of the invention.
Figure 27:
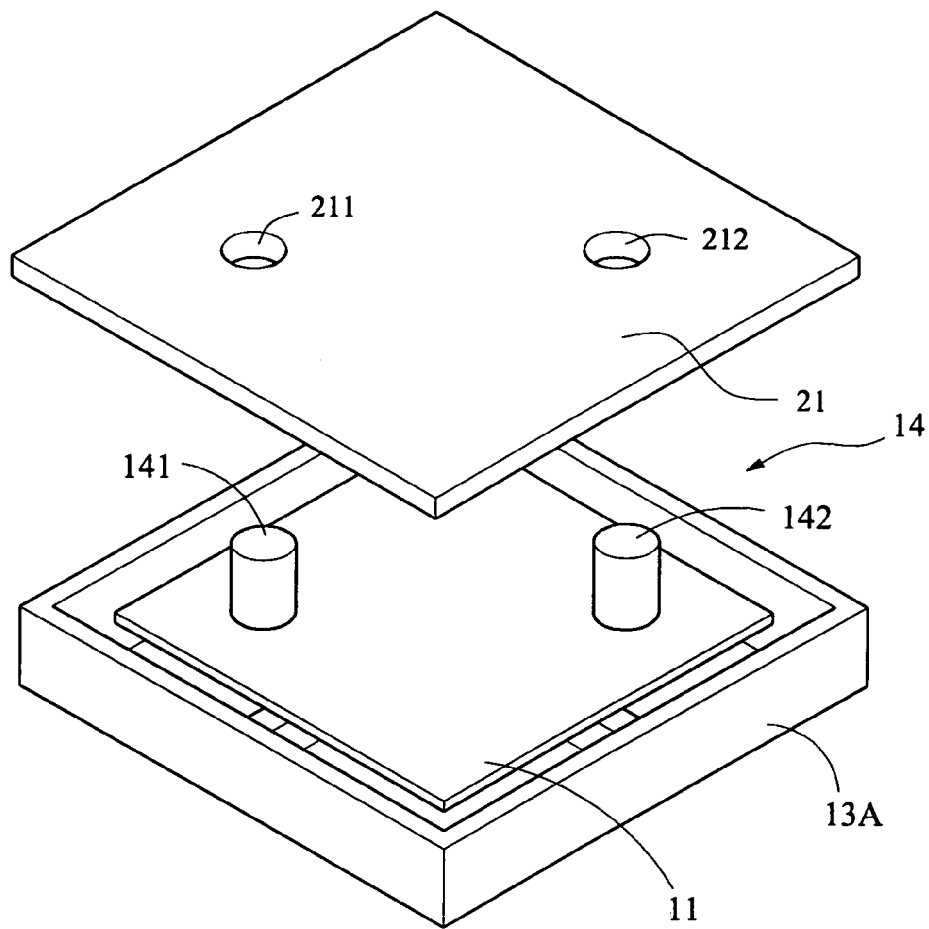
FIG. 27 is a perspective view of the formed portion of lamp unit shown in FIG. 26, where the portion of lamp unit is to be secured to yet another cover plate by welding.
Figure 28:
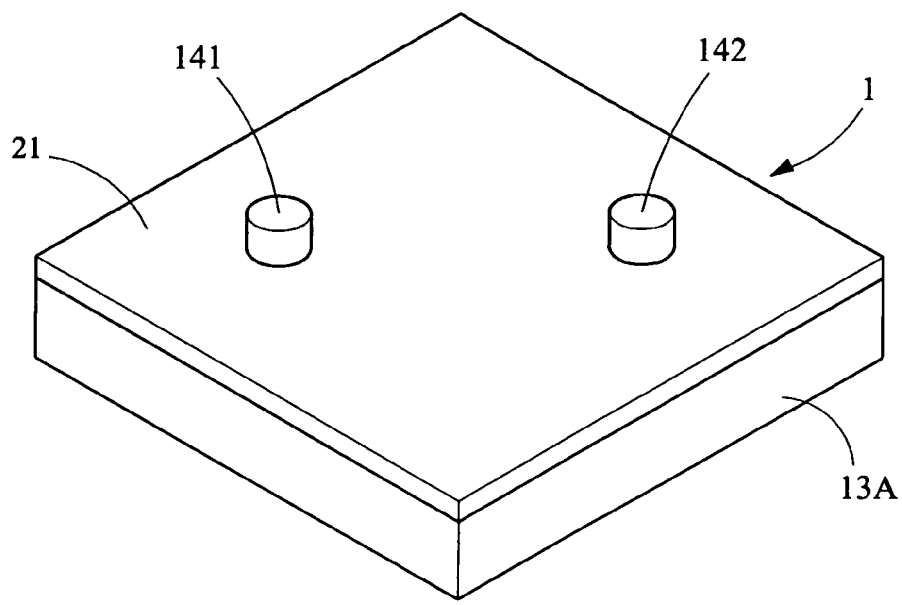
FIG. 28 is a perspective view of the formed lamp unit shown in FIG. 27.

Referring to FIGS. 26 and 27, a rib 139 is provided at an inner surface of each wall of the support 13A (i.e., in the space 130). The LED lamp 12B is a COB based LED (as shown), SMD based LED, or lead frame based LED. The LED lamp 12B and the rivet assembly 14 are mounted in the base 11. Next, turn the base 11 upside down prior to placing the base 11 on the support 13A to urge against the ribs 139. Next, a cover plate 21 is placed on the support 13A for covering with the shanks of the rivets 141 and 142 being projected from apertures 211, 212 of the cover plate 21. Next, the cover plate 21 and the support 13A are fastened together by means of a high-frequency or ultrasonic welder. As an end, a lamp unit 1 having exposed rivets 141 and 142 is formed (see FIG. 28).

Figure 29:
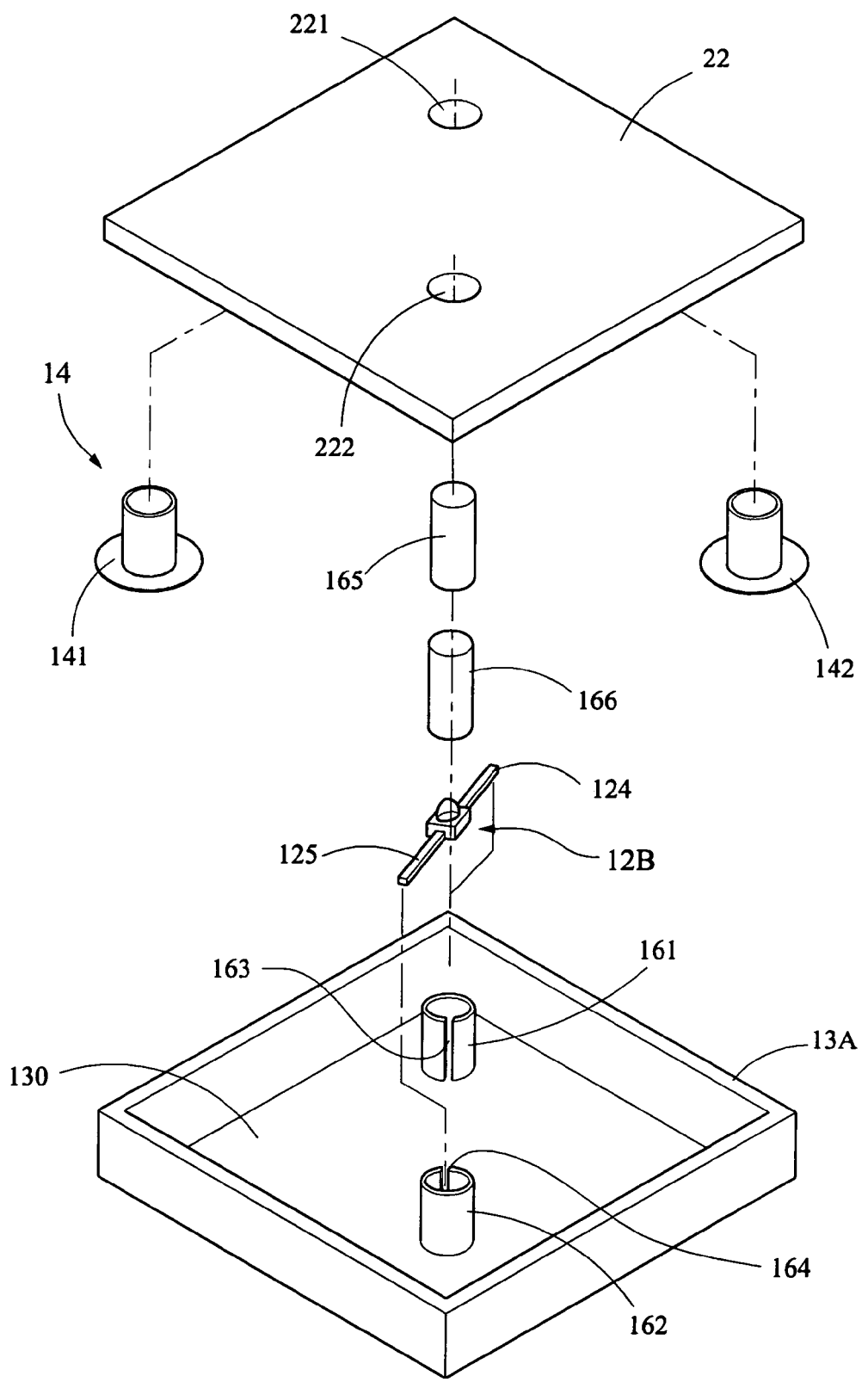
FIG. 29 is an exploded perspective view showing a lamp unit to be formed according to a seventh preferred embodiment of the invention.
Figure 30:
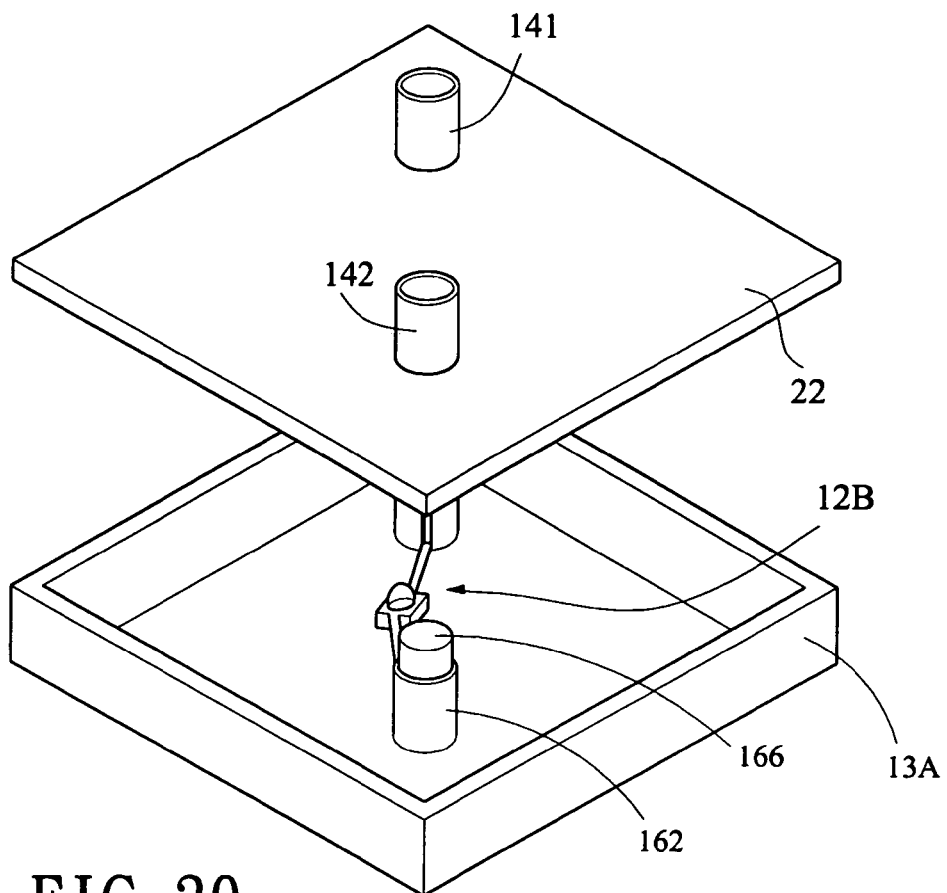
FIG. 30 is an exploded perspective view of the partially formed lamp unit shown in FIG. 29, where the support is to be secured to a further cover plate by welding.
Figure 30A:
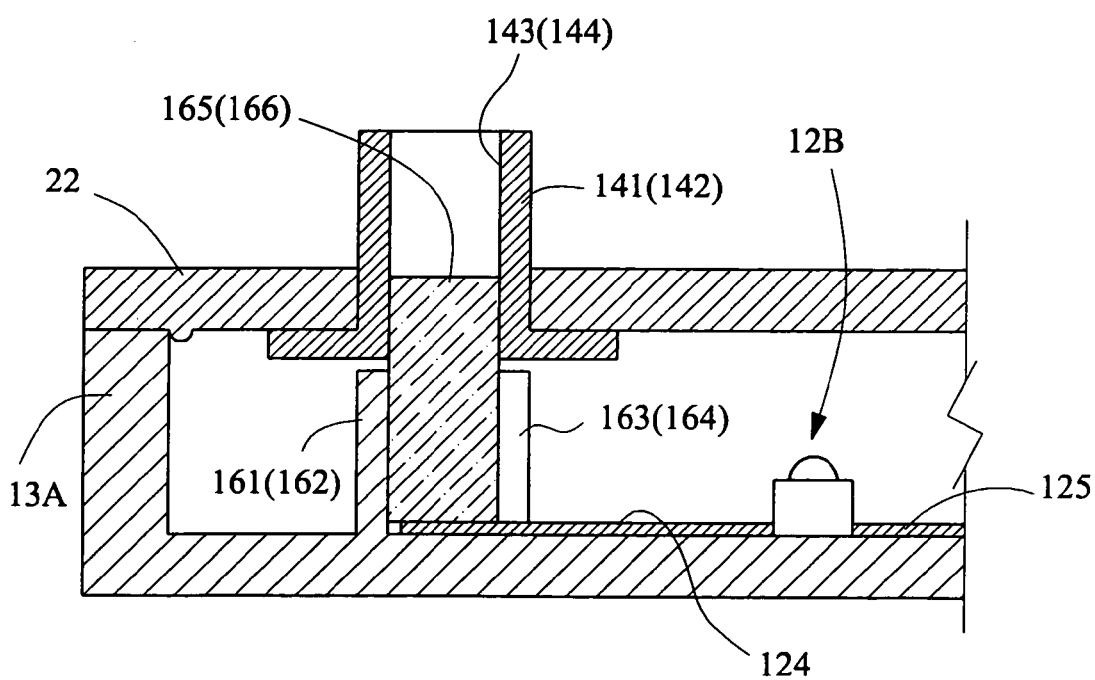
FIG. 30A is a cross-sectional view of a portion of the formed lamp unit shown in FIG. 30.
Figure 31:
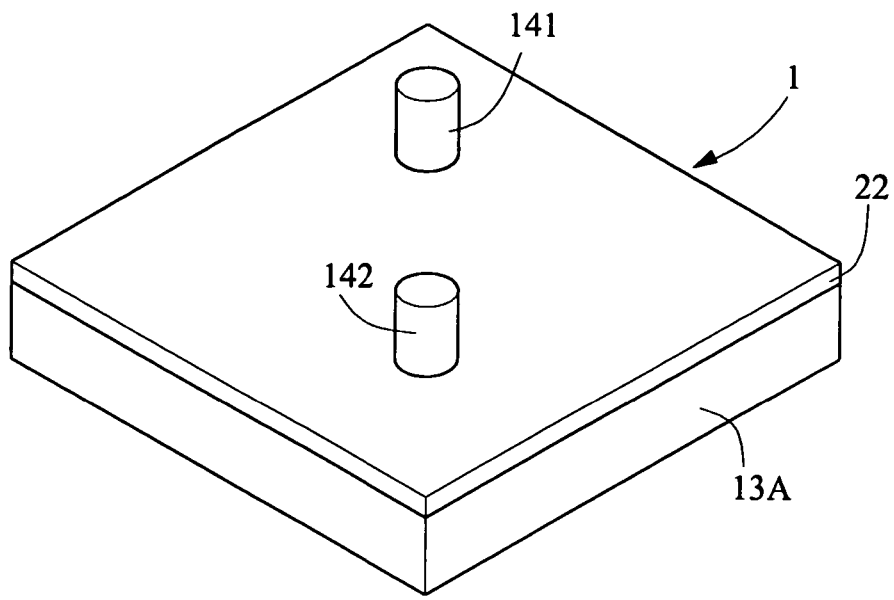
FIG. 31 is a perspective view of the formed lamp unit shown in FIG. 30.

Referring to FIGS. 29, 30, and 30A, a lamp unit 1 to be formed by welding according to a preferred embodiment of the invention is shown. On the space 130 there are provided two spaced, upright, hollow cylinders 161 and 162 each having a longitudinal slit 163 or 164. The leads 124 and 125 of the LED lamp 12B (i.e., lead frame based LED) are inserted in the slits 163 and 164 for fastening. Next, insert the rivets 141 and 142 through the apertures 221 and 222 of a cover plate 22 to project from the cover plate 22 which is in turn placed on the support 13A for covering. Next, conductive bars 165 and 166 are inserted in the slits 163 and 164 and the hollow shanks of the rivets 141 and 142 respectively. Next, fasten the cover plate 22 and the support 13A together by means of a high-frequency or ultrasonic welder. As an end, a lamp unit 1 having exposed rivets 141 and 142 is formed (see FIG. 31).

Figure 32:
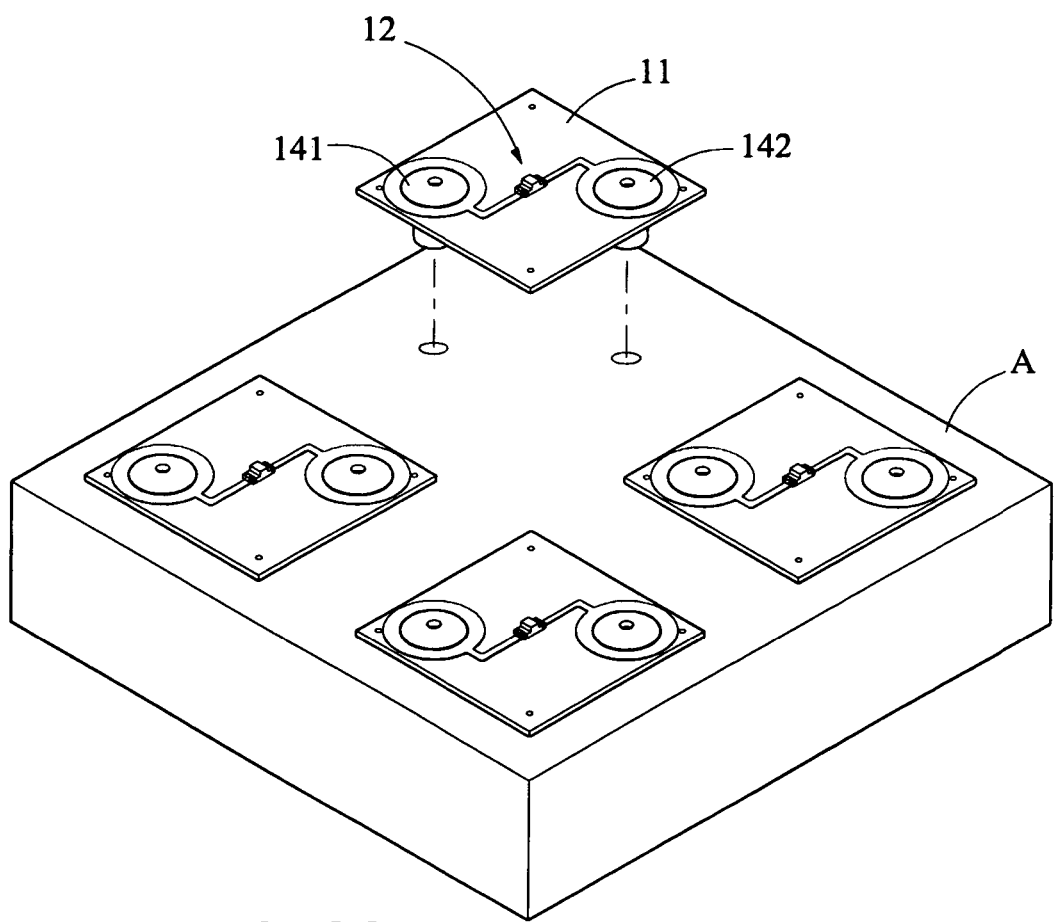
FIG. 32 is an exploded, perspective view showing portions of four lamp units placed on a die for forming four lamp units according to an eighth preferred embodiment of the invention.
Figure 33:
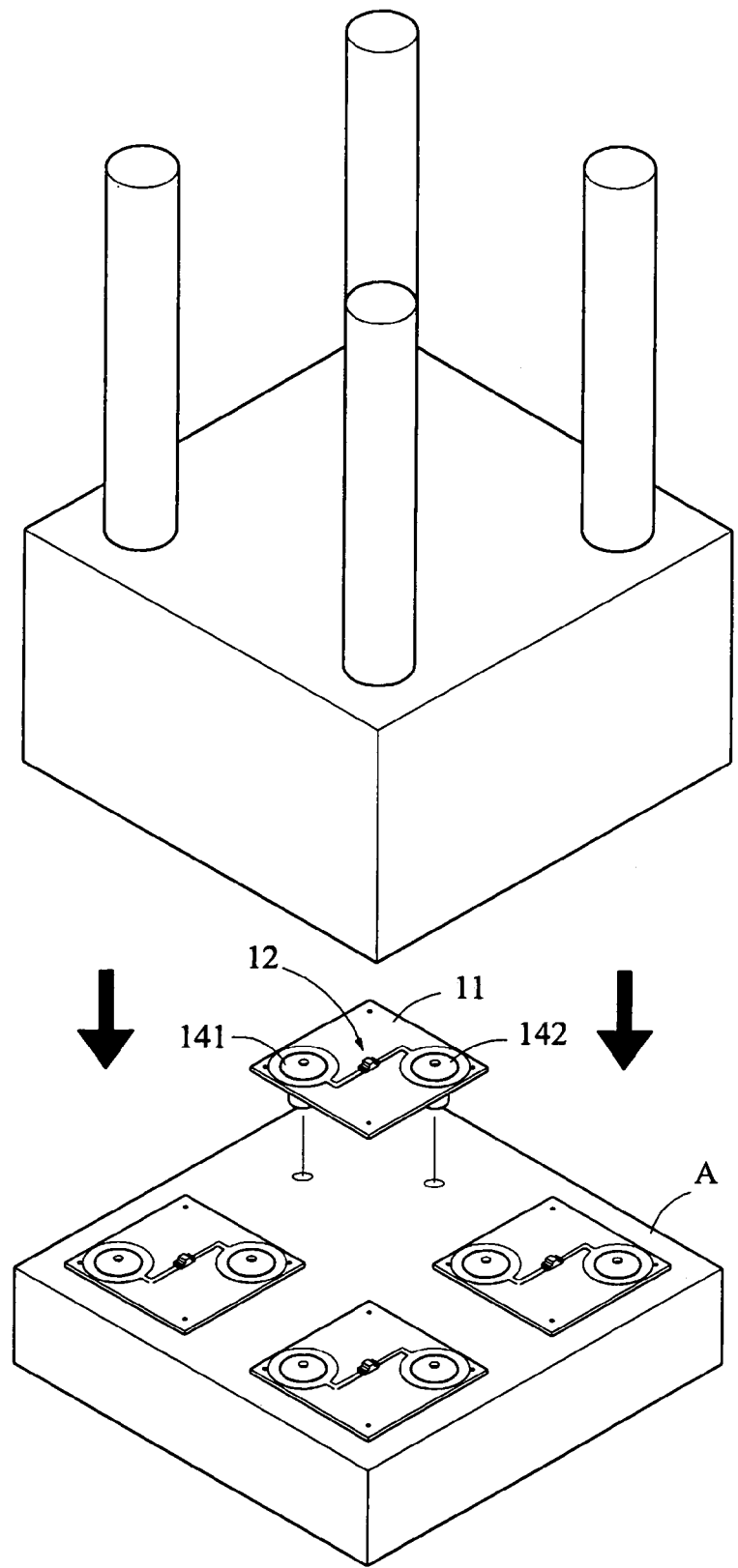
FIG. 33 is an exploded view showing a punch to be pressed on the die shown in FIG. 32.
Figure 34:
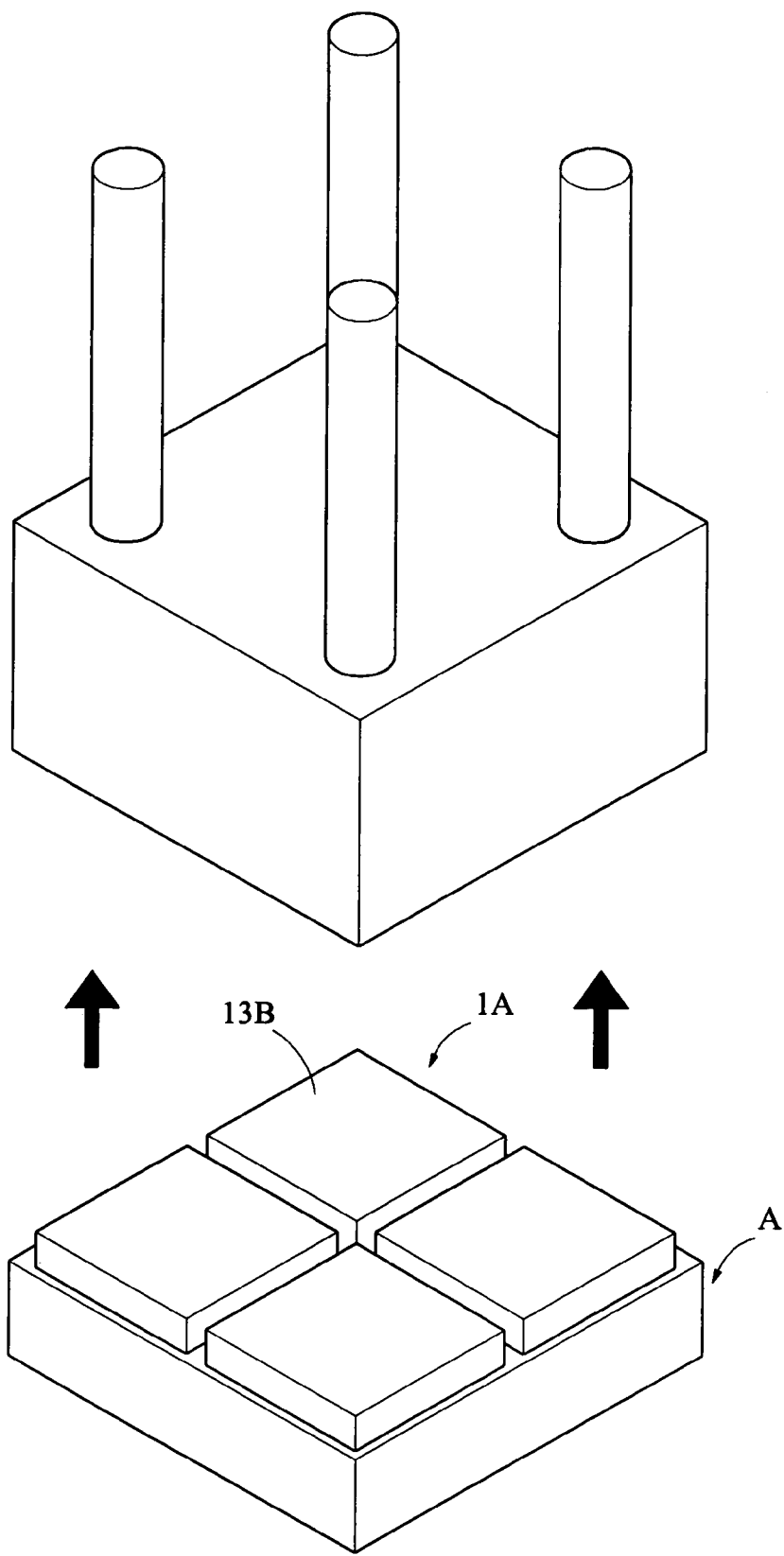
FIG. 34 is a view similar to FIG. 33, where four lamp units are formed on the die after lifting the punch.
Figure 35:
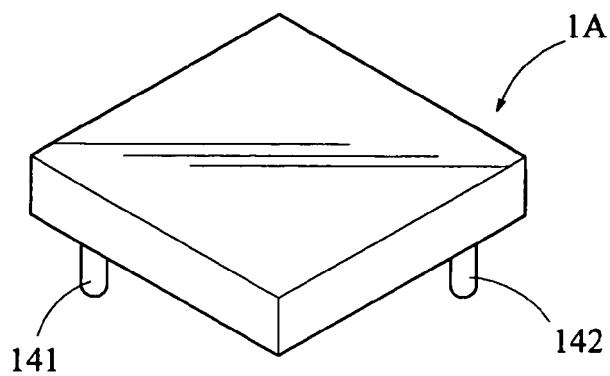
FIGS. 35 to 37 are perspective views showing three different shapes of lamp units formed in a manufacturing process the same as that shown in FIGS. 32 to 34.
Figure 36:
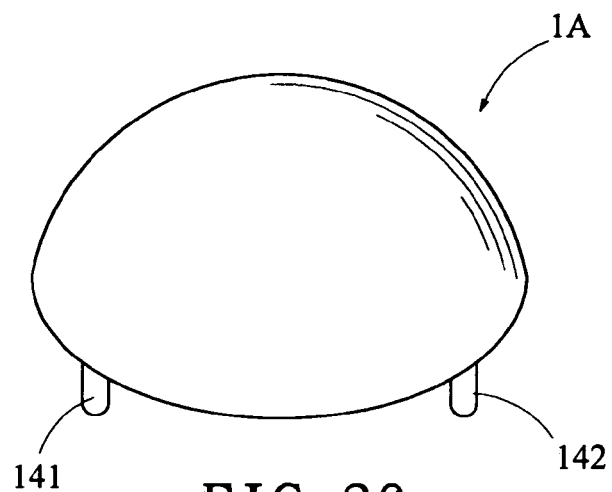
Figure 37:
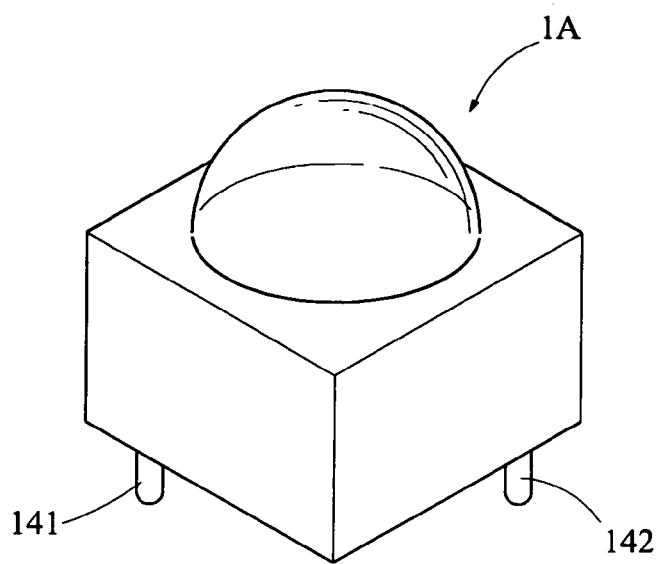

Referring to FIGS. 32 to 34, forming process of the lamp unit is illustrated. The LED lamp 12 is a COB based LED (as shown), SMD based LED, or lead frame based LED. The LED lamp 12 and the rivets 141 and 142 are mounted in the base 11. Next, the base 11 is placed on a die A of an injection molding machine. An encapsulation 13B is then formed after performing the manufacturing steps shown in FIGS. 33 and 34. FIGS. 35 to 37 show three different shapes of lamp units 1A formed in a manufacturing process the same as that shown in FIGS. 32 to 34 in which each lamp unit 1A has exposed rivets 141 and 142.

Figure 38:
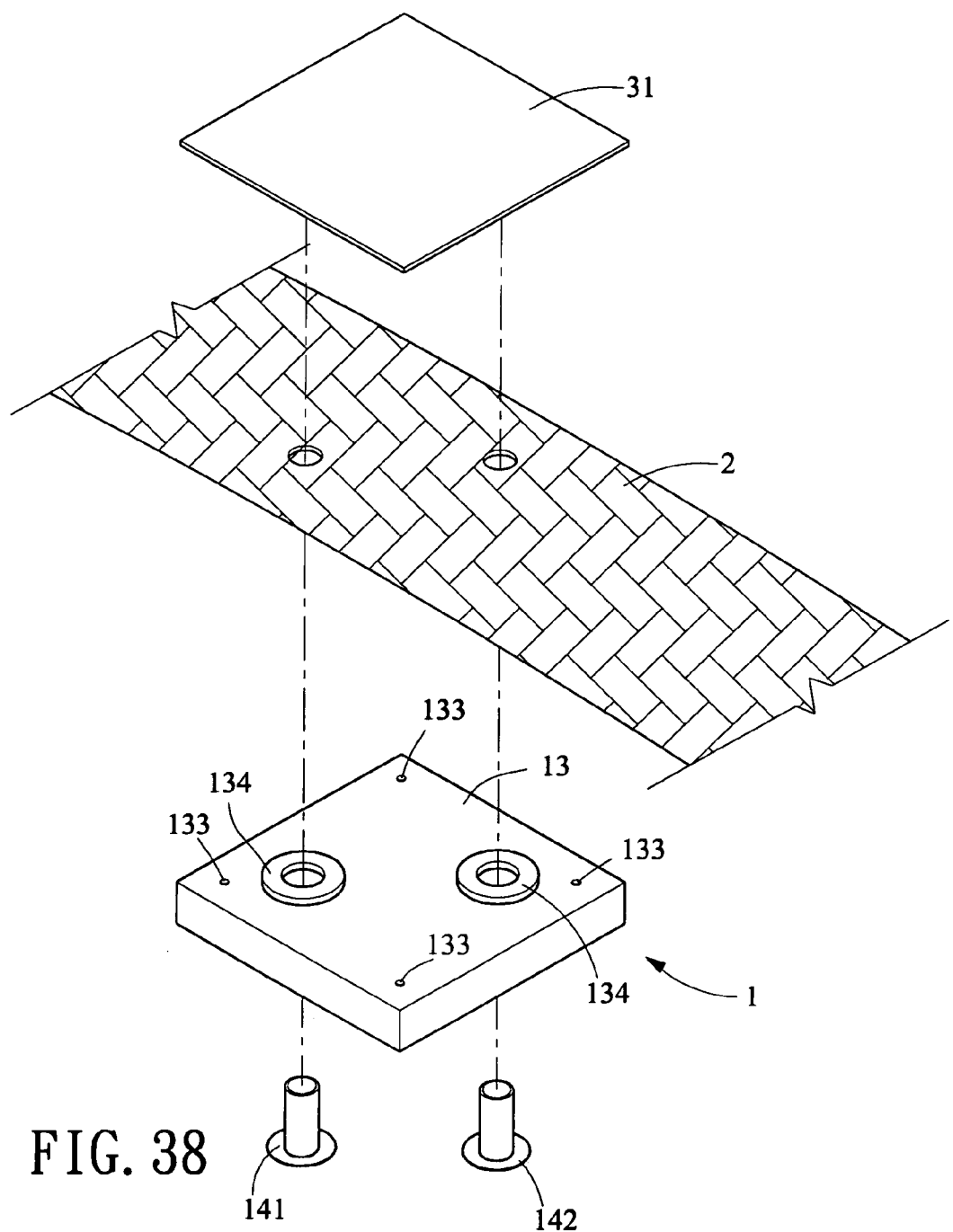
FIG. 38 is an exploded perspective view showing a waterproof treatment being performed on a lamp unit to be formed.
Figure 39:
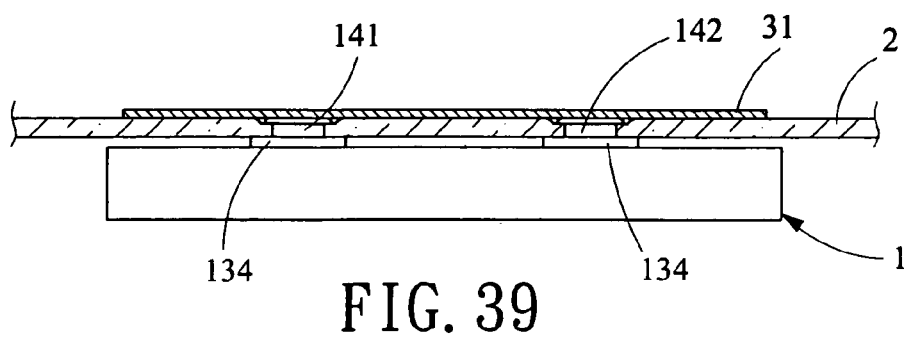
FIG. 39 is a side view in part section of the formed lamp unit shown in FIG. 38.

Referring to FIGS. 38 and 39, two waterproof rings 134 are integrally formed with a seat assembly 13. The rivets 141 and 142 are then inserted through the lamp unit 1, the waterproof rings 134, and the belt unit 2 prior to being flattened to compress the waterproof rings 134. As such, a portion of waterproof treatment is achieved in the joining portion of the rivets 141 and 142, the belt unit 2, and the lamp unit 1. Finally, a waterproof pad 31 is adhered on the belt unit 2 to cover the flattened portions of the rivets 141 and 142 thereon. As an end, a complete waterproof treatment is achieved.

Figure 40:
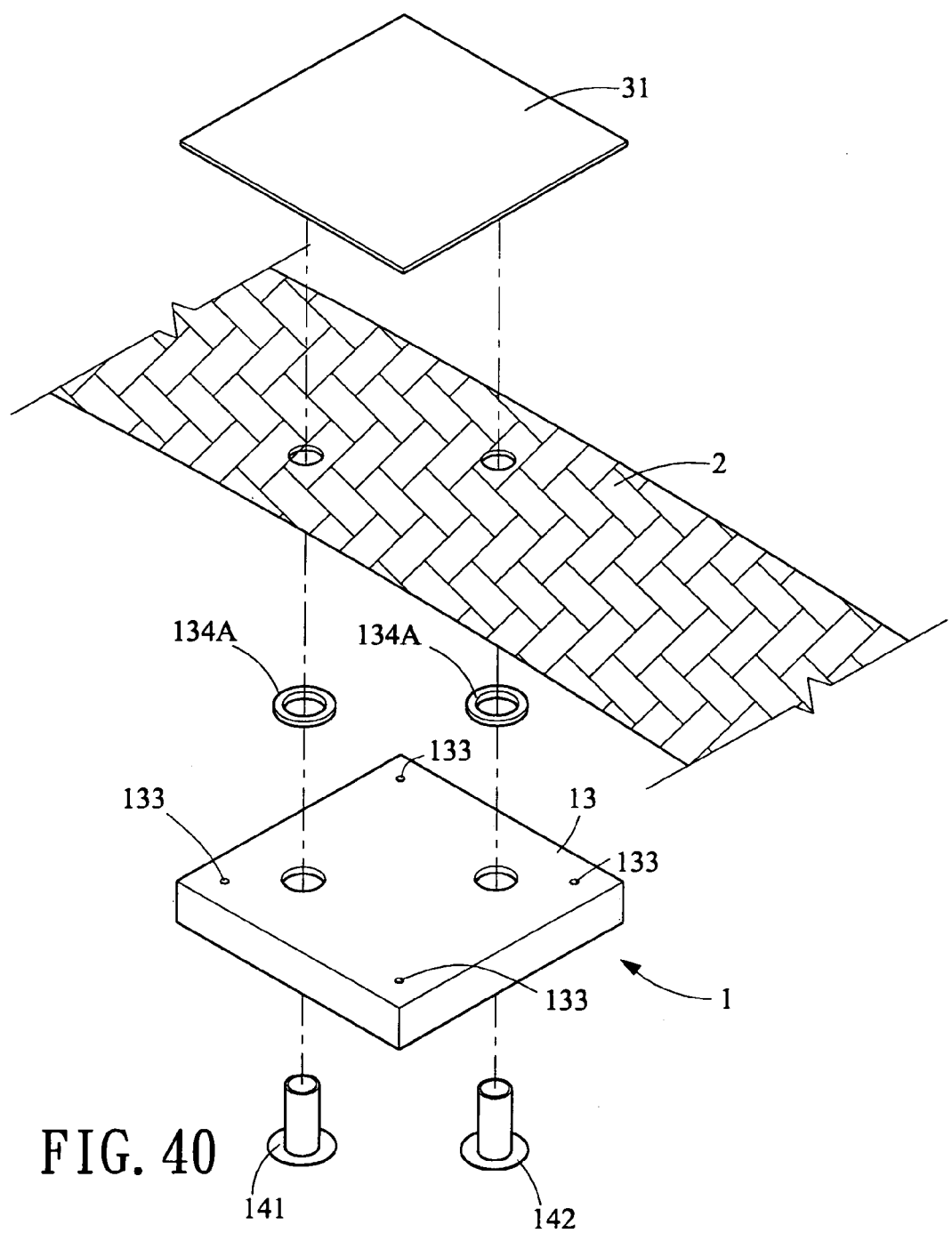
FIG. 40 is an exploded perspective view showing another waterproof treatment being performed on a lamp unit to be formed.
Figure 41:
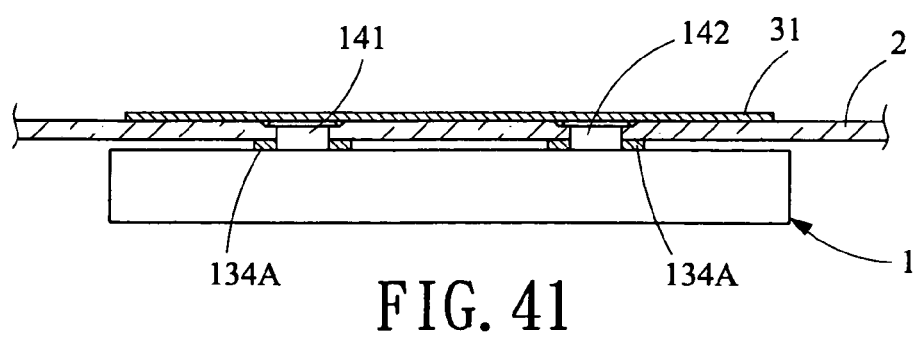
FIG. 41 is a side view in part section of the formed lamp unit shown in FIG. 40.

Referring to FIGS. 40 and 41, two waterproof rings 134A are placed on apertures of the seat assembly 13. The rivets 141 and 142 are then inserted through the lamp unit 1 (i.e., the apertures of the seat assembly 13), the waterproof rings 134A, and the belt unit 2 prior to being flattened to compress the waterproof rings 134A. As such, a portion of waterproof treatment is achieved in the joining portion of the rivets 141 and 142, the belt unit 2, and the lamp unit 1 together. Finally, a waterproof pad 31 is adhered on the belt unit 2 to cover the flattened portions of the rivets 141 and 142 thereon. As an end, a complete waterproof treatment is achieved.

Figure 42:
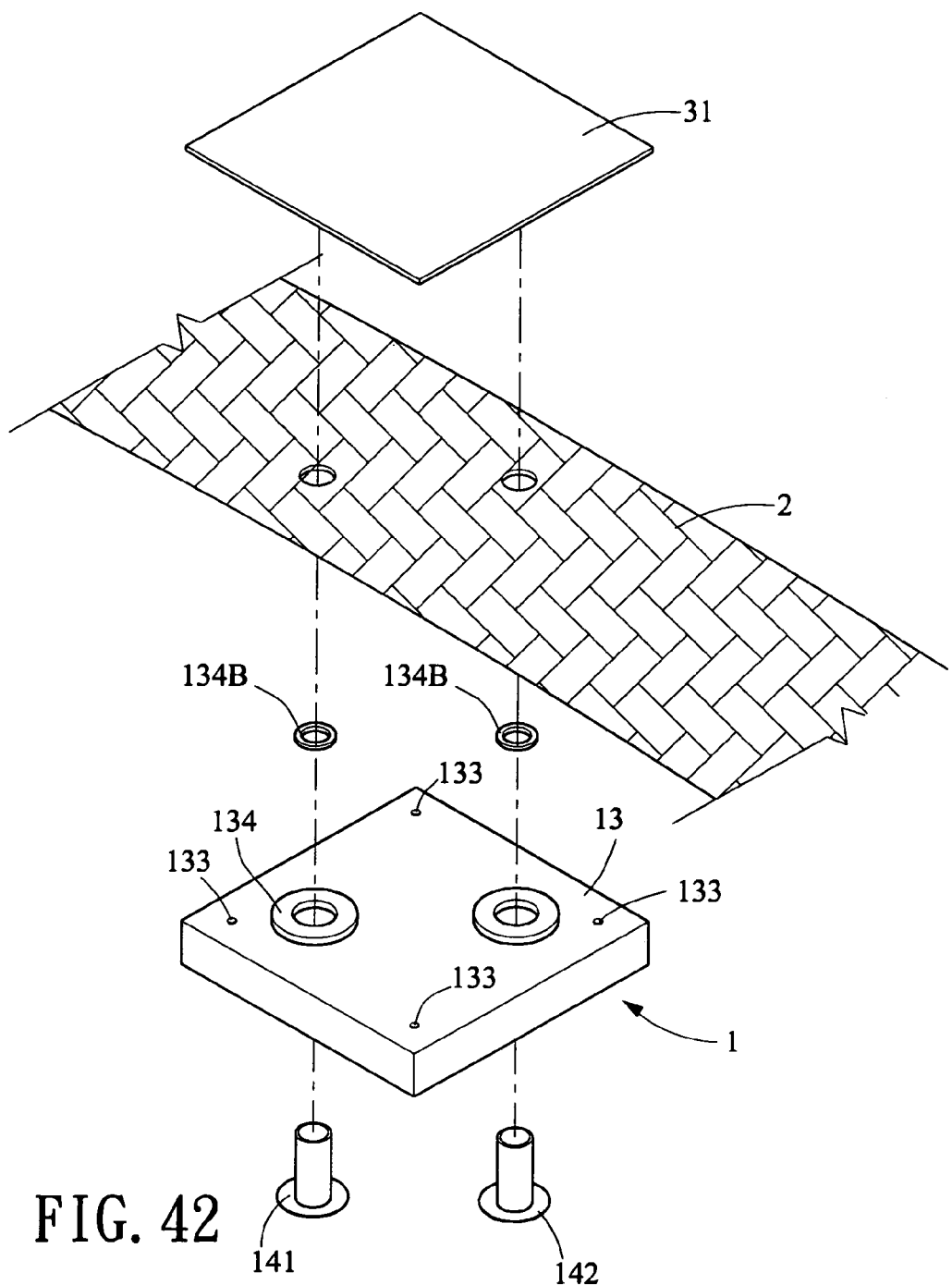
FIG. 42 is an exploded perspective view showing a further waterproof treatment being performed on a lamp unit to be formed.
Figure 43:
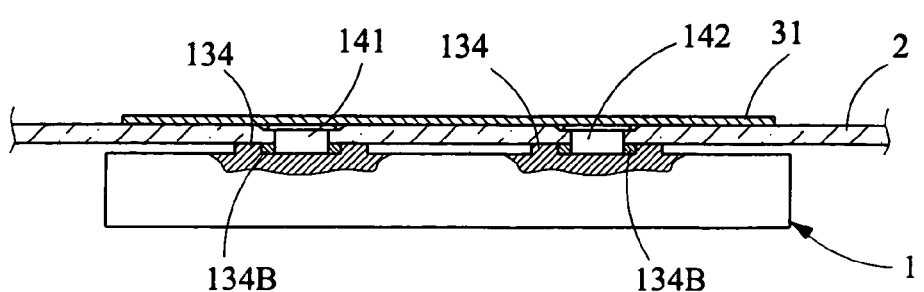
FIG. 43 is a side view in part section of the formed lamp unit shown in FIG. 42.

Referring to FIGS. 42 and 43, two waterproof rings 134 are integrally formed with a seat assembly 13. Also, two second waterproof rings 134B are in the waterproof rings 134. The rivets 141 and 142 are then inserted through the lamp unit 1, the waterproof rings 134, the second waterproof rings 134B, and the belt unit 2 prior to being flattened to compress the waterproof rings 134 and second waterproof rings 134B. As such, a portion of waterproof treatment is achieved in the joining portion of the rivets 141 and 142, the belt unit 2, and the lamp unit 1. Finally, a waterproof pad 31 is adhered on the belt unit 2 to cover the flattened portions of the rivets 141 and 142 thereon. As an end, a complete waterproof treatment is achieved.

In brief, a number of configurations of the invention are made possible. For example, after mounting the LED lamp 12 and the rivets 141 and 142 in the base 11, place one or more bases 11 on a die of injection molding machine. Finally, one or more encapsulations 13B (i.e., lamp units 1) are formed by punching. Alternatively, after mounting the LED lamp 12 and the rivets 141 and 142 in the support 13A, form an encapsulation 13B on the support 13A or place a cover plate 17, 18, or 19 on the support 13A prior to encapsulation. As to the rivets 141 and 142, they can be projected from the support 13A, the base 11, the encapsulation 13B, or the cover plate 17, 18, or 19. As to the encapsulation, it can be one of bond injection, bond injection to adhere to the cover plate 17, 18, or 19, plate based heating for encapsulation by means of a high-frequency or ultrasonic welder, and injection molding.

While the invention herein disclosed has been described by means of specific embodiments, numerous modifications and variations could be made thereto by those skilled in the art without departing from the scope and spirit of the invention set forth in the claims.

What is claimed is:

1. A lamp of a reflector device, comprising:
   a base including two or more apertures;
   a LED lamp mounted on the base; and
   a rivet assembly including two or more rivets;
   wherein the base further comprises a substrate including two or more contacts each having an opening in alignment with the corresponding aperture of the base and two or more electric wires each electrically interconnected the respective contact and the LED lamp;
   wherein when each of rivets is inserted through both the respective aperture of the base and the respective opening of the contact to be fastened thereat, whereby the rivets will functionally cooperate with the base, and the contacts to be electrically connected to the LED lamp; and
   wherein the lamp further comprising a support including side walls for forming a space and two or more apertures for enclosing the base, the LED lamp, and the rivet assembly.

2. The lamp of claim 1, further comprising the space filled with a bond prior to solidifying the LED lamp.

3. The lamp of claim 1, further comprising two or more waterproof rings at an underside of the support, each waterproof ring being put on a projected shank of the rivet.

4. The lamp of claim 3, further comprising two or more second waterproof rings in the first waterproof rings.

5. The lamp of claim 1, further comprising a peripheral groove around inner surfaces of the side walls of the support, the groove being adapted to fasten at the base.

6. The lamp of claim 1, further comprising a cover plate for covering the support.

7. The lamp of claim 6, further comprising a peripheral ridge disposed around exterior of the side walls of the support, and wherein the cover plate comprises a peripheral trough matingly engaged with the ridge for fastening the cover plate and the support together.

8. The lamp of claim 1, further comprising a peripheral trough disposed around inner surfaces of the side walls of the support, the trough being adapted to fasten at the base.

9. The lamp of claim 1, wherein the base is formed by injecting bond into a mold or shaping in a mold.

10. The lamp of claim 6, wherein the cover plate includes two or more apertures for permitting the rivets to pass through.

11. The lamp of claim 1, wherein the LED lamp is a COB based LED, a SMD based LED, or a lead frame based LED.

12. The lamp of claim 6, wherein the cover plate and the support are coupled together by a high-frequency or ultrasonic welder.

13. The lamp of claim 1, wherein the substrate is encapsulated by bond for fastening an electrical connection of the substrate, the LED lamp, and the rivet assembly together.

14. The lamp of claim 1, wherein the base further comprises a support including two or more upright, hollow projections, and a cover plate on a top of the support, the cover plate including two or more apertures, the LED lamp comprises a LED die on a first electric wire, and a lead coupled between the LED die and a second electric wire, and each of the rivets is inserted through the corresponding first aperture of the cover plate to project from an underside of the support, further comprising two or more conductive bars each having a first end inserted in the corresponding projections to electrically connect to the LED lamp and a second end inserted into the corresponding second aperture with the rivet fastened therein such that each of the rivets is electrically connected to the LED lamp.

15. A lamp of a reflector device, comprising:
  a substrate including two or more apertures, two or more contacts each having an opening in alignment with the corresponding aperture of the substrate and two or more electric wires;
  a LED lamp formed on the substrate, each of the electric wires electrically interconnecting the respective contact and the LED lamp;
  a rivet assembly including two or more rivets, each inserted through the respective apertures of the substrate and the respective opening of the contact and fastened thereat, the rivets being functionally cooperated with the substrate, and the contacts electrically connected to the LED lamp; and
  an encapsulation formed of bond for enclosing the substrate, the LED lamp, and the rivet assembly wherein the rivet assembly is projected from the encapsulation.

16. A method of manufacturing a lamp of a reflector device, comprising the steps of:
  (a) securing a LED lamp to a substrate and connecting the LED lamp to two or more contacts on the substrate through a respective wire formed on the substrate;
  (b) inserting two or more rivets through the respective contact and the substrate to have the rivets and contacts electrically couple to the LED lamp; and
  (c) encapsulating the substrate, the LED lamp, and the rivet assembly by bond wherein the rivet assembly is projected from the encapsulation.

17. The method of claim 16, wherein the step (c) further comprises the sub-steps of disposing the substrate on a support and filling bond in the support for encapsulation.

18. The method of claim 17, further comprising a cover plate for covering the support.

19. The method of claim 16, wherein the step (c) further comprises the sub-steps of filling bond in a support, and fastening the substrate together with the secured LED lamp and the rivet assembly on the bond for forming an encapsulation with the LED lamp facing the bond.

20. The method of claim 16, wherein the step (c) further comprises the sub-steps of forming the substrate containing the LED lamp and the rivet assembly in a base by injecting bond into a mold or shaping in a mold.

21. The method of claim 18, wherein the cover plate and the support are coupled together by soldering.

22. A method of manufacturing a lamp of a reflector device, comprising the steps of:
  (a) securing an LED lamp onto a support and connecting the LED lamp to two or more contacts on the support through a respective wire formed on the support;
  (b) inserting two or more rivets each through the respective contact and the support to have the rivets and the contact electrically couple to the LED lamp;
  (c) placing a cover plate on the support; and
  (d) fastening the cover plate and the support together by means of an ultrasonic welder.

23. The method of claim 22, wherein each of the rivets is projected from one of two or more apertures of the support.

24. A method of manufacturing a lamp of a reflector device, comprising the steps of:
  (a) securing an LED lamp onto a substrate and connecting the LED to two or more contacts on the substrate through a respective wire formed on the substrate;
  (b) inserting two or more rivets through the contact and the substrate to have the rivets and the contacts electrically couple to the LED lamp;
  (c) projecting the rivets out of the substrate to dispose on a support; and
  (d) securing the substrate to the support.

25. The method of claim 24, wherein the securing the substrate to the support in the step (d) is done by filling bond in the support.

26. The method of claim 24, wherein the securing the substrate to the support in the step (d) is done by means of an ultrasonic welder.

27. A method of manufacturing a lamp of a reflector device, comprising the steps of:
  (a) securing a LED lamp to two or more upright, hollow cylinders in a support;
  (b) inserting two or more rivets through a cover plate;
  (c) placing the cover plate on the support;
  (d) inserting the rivets through the support to project therefrom; and (e) fastening the cover plate and the support together by means of an ultrasonic welder to thereby have the rivets on the cover plate functionally cooperated with the cylinders in the support to be electrically connected to the LED lamp.

28. The method of claim 27, further comprising two or more conductive bars inserted in the cylinders to connect to the rivets.

* * * * *